(12) United States Patent
Noda et al.

(10) Patent No.: US 7,988,807 B2
(45) Date of Patent: Aug. 2, 2011

(54) LAMINATE BODY, METHOD, AND APPARATUS FOR MANUFACTURING ULTRATHIN SUBSTRATE USING THE LAMINATE BODY

(75) Inventors: Kazuki Noda, Tokyo (JP); Masaru Iwasawa, Kanagawa (JP)

(73) Assignee: 3M Innovative Properties Company, St. Paul, MN (US)

( * ) Notice: Subject to any disclaimer, the term of this patent is extended or adjusted under 35 U.S.C. 154(b) by 198 days.

(21) Appl. No.: 12/360,869

(22) Filed: Jan. 28, 2009

(65) Prior Publication Data

US 2009/0133812 A1 May 28, 2009

Related U.S. Application Data

(63) Continuation of application No. 10/513,953, filed on Nov. 9, 2004, now Pat. No. 7,534,498.

(51) Int. Cl.
*B32B 38/10* (2006.01)

(52) U.S. Cl. .............. 156/272.2; 156/153; 156/154; 156/155; 156/249; 156/275.5; 156/275.7; 156/344

(58) Field of Classification Search ............ 156/153, 156/155, 154, 249, 272.2, 275.5, 275.7, 344
See application file for complete search history.

(56) References Cited

U.S. PATENT DOCUMENTS

| | | | |
|---|---|---|---|
| 4,720,317 A * | 1/1988 | Kuroda et al. ............ 156/250 |
| 4,818,323 A | 4/1989 | d'Aragona et al. | |
| 5,414,297 A | 5/1995 | Morita et al. | |
| 5,476,566 A | 12/1995 | Cavasin | |
| 5,534,383 A * | 7/1996 | Takahashi et al. ............ 430/201 |
| 5,622,900 A * | 4/1997 | Smith ............ 438/464 |
| 5,872,046 A | 2/1999 | Kaeriyama et al. | |
| 5,994,204 A | 11/1999 | Young et al. | |
| 6,214,520 B1 | 4/2001 | Wolk et al. | |
| 6,235,141 B1 | 5/2001 | Feldman et al. | |
| 6,284,425 B1 | 9/2001 | Staral et al. | |
| 6,358,664 B1 | 3/2002 | Nirmal et al. | |
| 6,551,906 B2 | 4/2003 | Oka | |
| 6,620,649 B2 | 9/2003 | Uchida | |

(Continued)

FOREIGN PATENT DOCUMENTS

CN 1255522 A 6/2000

(Continued)

OTHER PUBLICATIONS

JP 2001200234 A English Machine Translation.*

*Primary Examiner* — Richard Crispino
*Assistant Examiner* — Elizabeth Royston
(74) *Attorney, Agent, or Firm* — Stephen F. Wolf

(57) ABSTRACT

Provided is a laminated body comprising a substrate to be ground and a support, where the substrate is ground to a very small thickness and can then be separated from the support without damaging the substrate. One embodiment of the present invention is a laminated body comprising a substrate to be ground, a joining layer in contact with the substrate to be ground, a photothermal conversion layer comprising a light absorbing agent and a heat decomposable resin, and a light transmitting support. After grinding the substrate surface which is opposite that in contact with the joining layer, the laminated body is irradiated through the light transmitting layer and the photothermal conversion layer decomposes to separate the substrate and the light transmitting support.

10 Claims, 5 Drawing Sheets

U.S. PATENT DOCUMENTS

| | | |
|---|---|---|
| 6,627,037 B1 * | 9/2003 | Kurokawa et al. ............ 156/344 |
| 6,696,219 B2 | 2/2004 | Yasunami et al. |
| 6,939,741 B2 | 9/2005 | Fukuoka et al. |
| 7,201,969 B2 | 4/2007 | Miyakawa et al. |
| 2001/0018404 A1 | 8/2001 | Oshima et al. |
| 2002/0014465 A1* | 2/2002 | Chung ...................... 211/126.1 |
| 2003/0077854 A1* | 4/2003 | Teshirogi et al. ............. 438/113 |
| 2004/0185639 A1 | 9/2004 | Fukuoka et al. |
| 2004/0259332 A1 | 12/2004 | Fukuoka et al. |

FOREIGN PATENT DOCUMENTS

| | | |
|---|---|---|
| DE | 100 51 938 A1 | 2/2002 |
| EP | 0 571 649 A1 | 12/1993 |
| EP | 0 976 802 A1 | 2/2000 |
| EP | 0 977 254 A2 | 2/2000 |
| EP | 0 999 250 A2 | 5/2000 |
| EP | 1 167 483 A1 | 1/2002 |
| EP | 1 229 388 A2 | 8/2002 |
| JP | 63-30581 | 2/1988 |
| JP | 05-335411 | 12/1993 |
| JP | 06-132432 | 5/1994 |
| JP | 6-302569 | 10/1994 |
| JP | 7-145357 | 6/1995 |
| JP | 11-026404 | 1/1999 |
| JP | 11-283279 | 10/1999 |
| JP | 2000-038556 | 2/2000 |
| JP | 2000-040677 | 2/2000 |
| JP | 2000-195826 | 7/2000 |
| JP | 2001200234 A * | 7/2001 |
| JP | 2001-246716 | 9/2001 |
| JP | 2002-353170 | 12/2002 |
| WO | WO 01/35457 A1 | 5/2001 |
| WO | WO 03/017363 A1 | 2/2003 |
| WO | WO 03/060972 A1 | 7/2003 |
| WO | WO 03/085714 A1 | 10/2003 |

* cited by examiner

LAMINATE BODY, METHOD, AND APPARATUS FOR MANUFACTURING ULTRATHIN SUBSTRATE USING THE LAMINATE BODY

RELATED APPLICATIONS

This is a divisional application of application U.S. Ser. No. 10/513,953, filed Nov. 9, 2004, now U.S. Pat. No. 7,534,498 B2, the disclosure of which is herein incorporated by reference in its entirety.

TECHNICAL FIELD

The present invention relates to a laminated body where a substrate to be ground, such as silicon wafer, fixed on a support can be easily separated from the support, and also relates to a method and an apparatus for manufacturing this laminated body and a method and an apparatus for producing a thinned substrate.

BACKGROUND

In various fields, reducing the thickness of a substrate often is desired. For example, in the field of quartz devices, reducing the thickness of a quartz wafer is desired so as to increase the oscillation frequency. Particularly, in the semiconductor industry, efforts to further reduce the thickness of a semiconductor wafer are in progress to respond to the goal of reducing the thickness of semiconductor packages as well as the high-density fabrication by chip lamination technology. Thickness reduction is performed by so-called back side grinding of a semiconductor wafer on the surface opposite that containing pattern-formed circuitry. Usually, in conventional techniques of grinding the back side, or surface, of a wafer and conveying it while holding the wafer with only a backgrinding protective tape, thickness reduction can be accomplished in practice only to a thickness of about 150 micrometers ($\mu$m) because of problems such as uneven thickness of the ground wafer or warping of the wafer with protective tape after grinding. For example, Japanese Unexamined Patent Publication (Kokai) No. 6-302569 discloses a method where a wafer is held on a ring-form frame through a pressure-sensitive adhesive tape, the back surface of this wafer held on the frame is ground and the wafer is conveyed to the next step. However, this method has not yet attained a remarkable improvement over the present level of wafer thickness which may be obtained without encountering the aforementioned problems of unevenness or warpage.

A method of grinding the back surface of a wafer and conveying it while firmly fixing the wafer on a hard support through an adhesive agent has also been proposed. This intends to prevent the breakage of a wafer during the back surface grinding and conveyance by supporting the wafer using such a support. According to this method, a wafer can be processed to a lower thickness level as compared with the above-described method, however, the ultrathin wafer cannot be separated from the support without breaking the wafer and therefore, this method cannot be practically used as a method of thinning a semiconductor wafer.

SUMMARY

Accordingly, the object of the present invention is to provide a laminated body in which a substrate to be ground is fixed on a support and the substrate to be ground can be easily peeled off from the support. The object of the present invention includes providing a method for manufacturing the laminated body, and a method and an apparatus for manufacturing an ultrathin substrate using the laminated body.

In one embodiment of the present invention, a laminated body is provided, the laminated body comprising a substrate to be ground; a joining layer in contact with said substrate to be ground; a photothermal conversion layer comprising a light absorbing agent and a heat decomposable resin; and a light transmitting support. After grinding the substrate surface which is opposite that in contact with the joining layer, the laminated body can be irradiated through the light transmitting layer to decompose the photothermal conversion layer and to separate the substrate and the light transmitting support. In this laminate, the substrate ground to a very small thickness can be separated from the support without breaking the substrate.

In another embodiment of the present invention, a method for manufacturing the above-described laminated body is provided, the method comprising coating on a light transmitting support a photothermal conversion layer precursor containing a light absorbing agent and a heat decomposable resin solution, or a monomer or oligomer as a precursor material of a heat decomposable resin; drying to solidify or cure the photothermal conversion layer precursor to form a photothermal conversion layer on the light transmitting support; applying an adhesive to a substrate to be ground or to the photothermal conversion layer to form a joining layer; and joining the substrate to be ground and the photothermal conversion layer by means of the joining layer under reduced pressure to form a laminated body.

By joining the substrate to be ground and the light transmitting support through the joining layer under reduced pressure, bubbles and dust contamination is prevented from forming inside the laminated body, so that a level surface can be formed and the substrate can maintain the evenness of thickness after grinding.

In still another embodiment of the present invention, an apparatus for manufacturing the above-described laminated body is provided, where a photothermal conversion layer formed on a light transmitting support is laminated on a substrate to be ground through a joining layer under reduced pressure, the apparatus comprising (1) a vacuum chamber capable of being reduced to a predetermined pressure, (2) a supporting part provided in the vacuum chamber, on which is disposed either (i) a substrate to be ground or (ii) a light transmitting support having photothermal conversion layer formed thereon, and (3) a holding/releasing means provided in the vacuum chamber and movable in the vertical direction at the upper portion of the supporting part, which can hold the other one of the substrate to be ground or the light transmitting support having a photothermal conversion layer formed thereon at its peripheral edges and can also release it when the substrate to be ground and the photothermal conversion layer are in close proximity.

When this apparatus is used, bubbles and dust contamination can be prevented from forming in the laminated body because the laminated body is manufactured under reduced pressure, and also the surface to be laminated is not damaged by the holding/releasing means.

In still another embodiment of the present invention, a method for manufacturing a reduced thickness substrate is provided, the method comprising preparing the above-described laminated body, grinding the substrate to a desired thickness, irradiating the photothermal conversion layer through the light transmitting support to decompose the photothermal conversion layer and thereby to separate the substrate from the light transmitting support after grinding, and peeling the joining layer from the substrate after grinding. In this method, a substrate can be ground to a desired thickness (for example, 150 μm or less, preferably 50 μm or less, more preferably 25 μm or less) on a support and after grinding the support is separated from the substrate using exposure to radiation energy, so that the joining layer remaining on the substrate after grinding can be easily peeled off from the substrate.

In still another embodiment, the invention provides An apparatus for manufacturing a ground substrate, comprising a grinder adapted for grinding the substrate of the laminated body as described above and described below in greater detail, a radiation energy source capable of providing a sufficiently high radiation energy to said photothermal conversion layer through said light transmitting support to decompose said photothermal conversion layer and thereby to separate said substrate and said light transmitting support after grinding, and a separator adapted for removing said joining layer from said substrate.

DETAILED DESCRIPTION

Figure 1A:
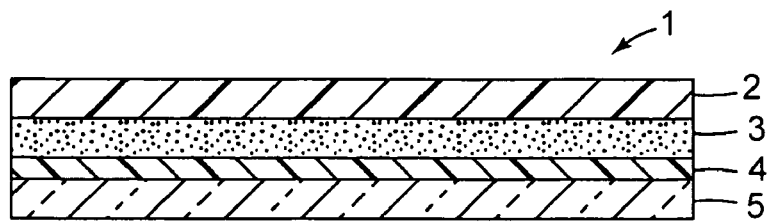
FIGS. 1(a)-(f) show cross-sectional views of several embodiments of the laminated body of the present invention.
Figure 1B:
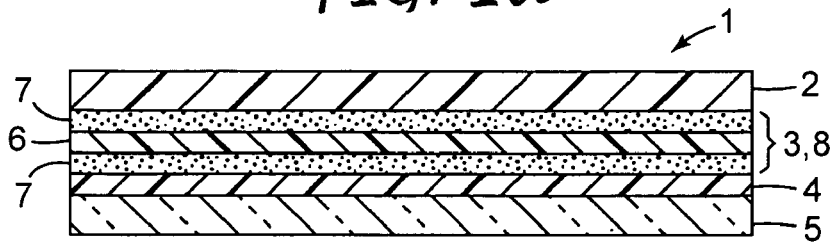

One important constituent feature of the laminated body of the present invention is that a photothermal conversion layer is provided between the substrate to be ground and the light transmitting support. The photothermal conversion layer decomposes upon irradiation with radiation energy such as laser beam, whereby the substrate can be separated from the support without causing any breakage. Therefore, the invention provides a substrate thinned to a range of thickness not achievable by conventional methods.

FIG. 1 shows some embodiments of the laminated body of the present invention. In the laminated body 1 of FIG. 1(a), a substrate 2 to be ground, a joining layer 3, a photothermal conversion layer 4 and a support 5 are laminated in this order. Also, as shown in FIG. 1(b), the joining layer 3 may be a double-faced adhesive tape 8 comprising a first intermediate layer (film) 6 having provided on both surfaces thereof a pressure-sensitive adhesive agent 7. Furthermore, as shown in FIGS. 1(c) and (d), the joining layer 3 may be a double-faced adhesive tape 8 integrated with the photothermal conversion layer 4. Still further, as shown in FIG. 1(e), the joining layer 3 may be a double-faced adhesive tape 8 in which the photothermal conversion layer 4 itself comprises a pressure-sensitive adhesive photothermal conversion layer 4' having a pressure-sensitive adhesive characteristics. As shown in FIG. 1(f), it is also possible that a first intermediate layer 6 is provided between the joining layer 3 and the photothermal conversion layer 4, a second intermediate layer 9 is provided between the photothermal conversion layer 4 and the support 5, and the second intermediate layer 9 and the support 5 are joined through another joining layer 3'.

The elements comprising the laminated body of the present invention are described in greater detail below.

Substrate

The substrate may be, for example, a brittle material difficult to thin by conventional methods. Examples thereof include semiconductor wafers such as silicon and gallium arsenide, a rock crystal wafer, sapphire and glass.

Light Transmitting Support

The light transmitting support is a material capable of transmitting radiation energy, such as a laser beam used in the present invention, and the material is required to keep the ground body in a flat state and not cause it to break during grinding and conveyance. The light transmittance of the support is not limited as long as it does not prevent the transmittance of a practical intensity level of radiation energy into the photothermal conversion layer to enable the decomposition of the photothermal conversion layer. However, the transmittance is preferably, for example, 50% or more. Also, in order to prevent the ground body from warping during grinding, the light transmitting support preferably has a sufficiently high stiffness and the flexural rigidity of the support is preferably $2\times10^{-3}$ (Pa·m$^3$) or more, more preferably $3\times10^{-2}$ (Pa·m$^3$) or more. Examples of useful supports include glass plates and acrylic plates. Furthermore, in order to enhance the adhesive strength to an adjacent layer such as photothermal conversion layer, the support may be surface-treated with a silane coupling agent or the like, if desired. In the case of using a UV-curable photothermal conversion layer or joining layer, the support preferably transmits ultraviolet radiation.

The support is sometimes exposed to heat generated in the photothermal conversion layer when the photothermal conversion layer is irradiated or when a high temperature is produced due to frictional heating during grinding. Also, for the purpose of forming a metal film on the substrate a process such as vapor deposition, plating or etching may be additionally provided before separating the ground substrate from the support. Particularly, in the case of a silicon wafer, the support is sometimes subjected to a high-temperature process to form an oxide film. Accordingly, a support having heat resistance, chemical resistance and a low expansion coefficient is selected. Examples of support materials having these properties include borosilicate glass available as Pyrex™ and Tenpax™ and alkaline earth boro-aluminosilicate glass such as Corning™ #1737 and #7059.

To obtain the desired thickness uniformity after grinding of the substrate, the thickness of the support is preferably uniform. For example, for grinding a silicon wafer to 50 μm or less and attaining evenness of ±10% or less, the variability in the thickness of the support must be reduced to ±2 μm or less. In the case where the support is repeatedly used, the support also preferably has scratch resistance. For repeatedly using the support, the wavelength of the radiation energy and the support must be selected to suppress the damage to the support by the radiation energy. For example, when Pyrex glass is used as the support and a third harmonic generation YAG laser (355 nm) is employed, the separation of the support and the substrate can be performed, however, such a support exhibits low transmittance at the wavelength of this laser and absorbs the radiation energy, as a result, the support is thermally damaged and cannot be reused in some cases.

Photothermal Conversion Layer

The photothermal conversion layer contains a light absorbing agent and a heat decomposable resin. Radiation energy applied to the photothermal conversion layer in the form of a laser beam or the like is absorbed by the light absorbing agent and converted into heat energy. The heat energy generated abruptly elevates the temperature of the photothermal conversion layer and the temperature reaches the thermal decomposition temperature of the heat decomposable resin (organic component) in the photothermal conversion layer resulting in heat decomposition of the resin. The gas generated by the heat decomposition is believed to form a void layer (such as air space) in the photothermal conversion layer and divide the photothermal conversion layer into two parts, whereby the support and the substrate are separated.

The light absorbing agent absorbs radiation energy at the wavelength used. The radiation energy is usually a laser beam having a wavelength of 300 to 11,000 nanometers (nm), preferably 300 to 2,000 nm and specific examples thereof include a YAG laser which emits light at a wavelength of 1,064 nm, a second harmonic generation YAG laser at a wavelength of 532 nm, and a semiconductor laser at a wavelength of 780 to 1,300 nm. Although the light absorbing agent varies depending on the wavelength of the laser beam, examples of the light absorbing agent which can be used include carbon black, graphite powder, microparticle metal powders such as iron, aluminum, copper, nickel, cobalt, manganese, chromium, zinc and tellurium, metal oxide powders such as black titanium oxide, and dyes and pigments such as an aromatic diamino-based metal complex, an aliphatic diamine-based metal complex, an aromatic dithiol-base metal complex, a mercaptophenol-based metal complex, a squarylium-based compound, a cyanine-based dye, a methine-based dye, a naphthoquinone-based dye and an anthraquinone-based dye. The light absorbing agent may be in the form of a film including a vapor deposited metal film. Among these light absorbing agents, carbon black is particularly useful, because the carbon black significantly decreases the force necessary for separating the substrate from the support after the irradiation and accelerates the separation.

The concentration of the light absorbing agent in the photothermal conversion layer varies depending on the kind, particle state (structure) and dispersion degree of the light absorbing agent but the concentration is usually from 5 to 70 vol % in the case of general carbon black having a particle size of approximately from 5 to 500 nm. If the concentration is less than 5 vol %, heat generation of the photothermal conversion layer may be insufficient for the decomposition of the heat decomposable resin, whereas if it exceeds 70 vol %, the photothermal conversion layer becomes poor in the film-forming property and may readily cause failure of adhesion to other layers. In the case where the adhesive used as the joining layer is a UV-curable adhesive, if the amount of carbon black is excessively large, the transmittance of the ultraviolet ray for curing the adhesive decreases. Therefore, in the case of using a UV-curable adhesive as the joining layer, the amount of carbon black should be 60 vol % or less. In order to reduce the force at the time of removing the support after irradiation and thereby prevent abrasion of the photothermal conversion layer during grinding (such as abrasion due to abrasive in wash water), carbon black is preferably contained in the photothermal conversion layer in an amount of 20 to 60 vol %, more preferably from 35 to 55 vol %.

Figure 1C:
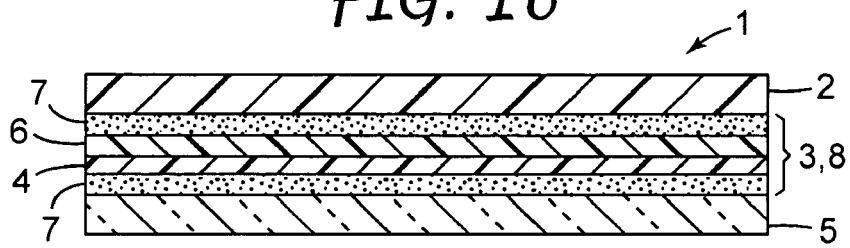
Figure 1D:
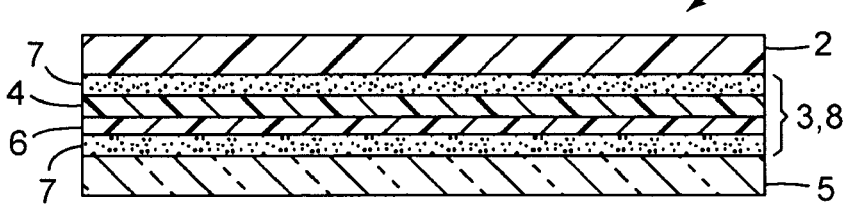
Figure 1E:
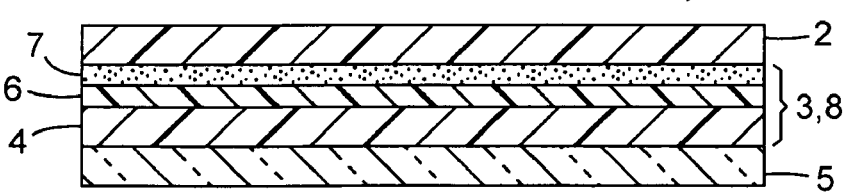

Examples of the heat decomposable resin which can be used include gelatin, cellulose, cellulose ester (e.g., cellulose acetate, nitrocellulose), polyphenol, polyvinyl butyral, polyvinyl acetal, polycarbonate, polyurethane, polyester, polyorthoester, polyacetal, polyvinyl alcohol, polyvinylpyrrolidone, a copolymer of vinylidene chloride and acrylonitrile, poly(meth)acrylate, polyvinyl chloride, silicone resin and a block copolymer comprising a polyurethane unit. These resins can be used individually or in combination of two or more thereof. The glass transition temperature (Tg) of the resin is preferably room temperature (20° C.) or more so as to prevent the re-adhesion of the photothermal conversion layer once it is separated due to the formation of a void layer as a result of the thermal decomposition of the heat decomposable resin, and the Tg is more preferably 100° C. or more so as to prevent the re-adhesion. In the case where the light transmitting support is glass, in order to increase the adhesive force between the glass and the photothermal conversion layer, a heat decomposable resin having within the molecule a polar group (e.g., —COOH, —OH) capable of hydrogen-bonding to the silanol group on the glass surface can be used. Furthermore, in applications requiring a chemical solution treatment such as chemical etching, in order to impart chemical resistance to the photothermal conversion layer, a heat decomposable resin having within the molecule a functional group capable of self-crosslinking upon heat treatment, a heat decomposable resin capable of being crosslinked by ultraviolet or visible light, or a precursor thereof (e.g., a mixture of monomers and/or oligomers) may be used. For forming the photothermal conversion layer as a pressure-sensitive adhesive photothermal conversion layer as shown in FIG. 1(e), a pressure-sensitive adhesive polymer formed from poly(meth)acrylate or the like, as may be used for the heat decomposable resin, is employed.

Transparent Filler

The photothermal conversion layer may contain a transparent filler, if desired. The transparent filler acts to prevent the re-adhesion of the photothermal conversion layer once it is separated due to the formation of a void layer as a result of the thermal decomposition of the heat decomposable resin. Therefore, the force required for the separation of the substrate and the support, after grinding of the substrate and subsequent irradiation, can be further reduced. Furthermore, since the re-adhesion can be prevented, the latitude in the selection of the heat decomposable resin is broadened. Examples of the transparent filler include silica, talc and barium sulfate. Use of the transparent filler is particularly advantageous when a UV-curable adhesive is used as the joining layer. This is presently believed to be due to the following reasons. When a particulate light absorbing agent such as carbon black is used, the light absorbing agent has a function of reducing the force for separation and also functions to disrupt the transmittance of ultraviolet light. Therefore, when a UV-curable adhesive is used as the joining layer, the curing may not proceed satisfactorily or may require a very long time. In such a case, when a transparent filler is used, the substrate and the support can be separated easily after irradiation without disturbing the curing of the UV-curable adhesive. The amount of the transparent filler can be determined, when a particulate light absorbing agent such as carbon black is used, by the total amount with the light absorbing agent. The total amount of the particulate light absorbing agent (e.g., carbon black) and the transparent filler in the photothermal conversion layer is preferably from 5 to 70 vol % based on the volume of the photothermal conversion layer. With the total amount in this range, the force for the separation of the substrate and the support can be sufficiently reduced. However, the force for the separation is also affected by the shape of the particulate light absorbing agent and the transparent filler. More specifically, the force for the separation is sometimes more effectively reduced with a small filler amount in the case where the particle shape is complicated (a particle state resulting from more complex structure) than in the case where the particle shape is relatively simple, such as nearly spherical.

Therefore, the total amount of the particulate light absorbing agent and the transparent filler is prescribed based on the "top filler volume concentration" (TFVC) in some cases. This means a filler volume concentration such that when a mixture of the particulate absorbing agent and the transparent filler is left standing in a dry state and the heat decomposable resin is mixed with the filler in an amount of just filling the volume of voids. That is, the TFVC when the heat decomposable resin is mixed with the filler in an amount of just filling the volume of voids in the mixture of the particulate light absorbing agent and the transparent filler is 100% of the top filler volume concentration. The total amount of the particulate light absorbing agent and the transparent filler in the photothermal conversion layer is preferably 80% or more, more preferably 90% or more, of the top filler volume concentration. In further explanation, the total volume percentage of the fillers (e.g., carbon black and transparent filler) is represented by "A", and the Top Filler Volume Concentration, TFVC (total volume percentage of the fillers with resin filling the void volume of the fillers) is represented by "B", then A/B preferably is greater than about 80%, (more preferably A/B>90%).

The void volume of the fillers can be shown as oil absorption with the liquid amount required to fill the void volume of fillers by the unit weight. Regarding carbon black, the measured number in the vendor catalogue is used, and regarding transparent filler (e.g., silica), a general number (200 g/cc) of this kind of silica is used.

While not being bound by any theory, it is presently believed that the light absorber (e.g., carbon black) in the photothermal conversion layer absorbs the laser energy that is irradiated through the transparent support and converts it into heat, which decomposes the matrix-resin and generates gas or voids. As a result, the voids separate this layer into parts such as two layers, and then the semiconductor wafer is released from the support. The surface separated by the voids can re-contact the surfaces, given time. The surface has carbon black particles as well as residual resin, which resin is reduced in molecular weight by thermal decomposition. In re-contacting (e.g., re-adhering), this residual resin can increase adhesion. On the other hand, when not only the photothermal conversion layer but also the adhesive layer is soft, the re-contacting area can be relatively large, which makes the adhesion larger and makes it very difficult to release the ultra-thinned wafer from the support without damage or breaking. In this invention, by setting A/B>80%, preferably A/B>90%, the residual resin on the release surface is reduced. Thereby the adhesion generated by re-contacting can be minimized. Further, by raising the amount of carbon black together with using the transparent filler to meet A/B>80%, or 90%, the thickness desired for the photothermal conversion layer at least can be kept, and simultaneously UV transparency such as is desired when the adhesive layer is of the UV cure type.

Thus, with the total amount in this range, the substrate and the support are easily separated after irradiation.

The thickness of the photothermal conversion layer is generally around 0.5 μm. If the thickness is to low, partial exposure of the adjacent adhesive layer to release surface occurs, which can raise adhesion of the release surface especially when the adhesive layer is relatively soft, and this can result in difficult removable (without breakage) of the ultra-thinned wafer.

The photothermal conversion layer may contain other additives, if desired. For example, in the case of forming the layer by coating a heat decomposable resin in the form of a monomer or an oligomer and thereafter polymerizing or curing the resin, the layer may contain a photo-polymerization initiator. Also, the addition of a coupling agent (integral blend method, i.e., the coupling agent is used as an additive in the formulation rather than as a pre-surface-treatment agent) for increasing the adhesive force between the glass and the photothermal conversion layer, and the addition of a crosslinking agent for improving the chemical resistance are effective for their respective purposes. Furthermore, in order to promote the separation by the decomposition of the photothermal conversion layer, a low-temperature gas generator may be contained. Representative examples of the low-temperature gas generator which can be used include a foaming agent and a sublimating agent. Examples of the foaming agent include sodium hydrogencarbonate, ammonium carbonate, ammonium hydrogencarbonate, zinc carbonate, azodicarbonamide, azobisisobutylonitrile, N,N'-dinitrosopentamethylenetetramine, p-toluenesulfonylhydrazine and p,p-oxybis(benzenesulfonylhydrazide). Examples of the sublimating agent include 2-diazo-5,5-dimethylcyclohexane-1,3-dione, camphor, naphthalene, borneol, butyramide, valeramide, 4-tert-butylphenol, furan-2-carboxylic acid, succinic anhydride, 1-adamantanol and 2-adamantanone.

The photothermal conversion layer can be formed by mixing the light absorbing agent such as carbon black, the heat decomposable resin and a solvent to prepare a precursor coating solution, coating this solution on the support, and drying it. Also, the photothermal conversion layer can be formed by mixing the light absorbing agent, a monomer or an oligomer as a precursor material for the heat decomposable resin and, optionally, additives such as photo-polymerization initiator, and a solvent, if desired, to prepare a precursor coating solution in place of the heat decomposable resin solution, coating the solution on the support, drying and polymerizing/curing it. For the coating, a general coating method suitable for coating on a hard support, such as spin coating, die coating, and roll coating, can be used. In the case of forming the photothermal conversion layer in a double-faced tape as shown in FIGS. 1(c) to (e), the photothermal conversion layer can be formed on a film by using a coating method such as die coating, gravure coating, and knife coating.

In general, the thickness of the photothermal conversion layer is not limited as long as it permits the separation of the support and the substrate, but it is usually 0.1 μm or more. If the thickness is less than 0.1 μm, the concentration of the light absorbing agent required for sufficient light absorption becomes high and this deteriorates the film-forming property, and as a result, adhesion to the adjacent layer may fail. On the other hand, if the thickness of the photothermal conversion layer is 5 μm or more while keeping constant the concentration of the light absorbing agent required to permit the separation by the thermal decomposition of the photothermal conversion layer, the light transmittance of the photothermal conversion layer (or a precursor thereof) becomes low. As a result, when a photo-curable, for example, an ultraviolet (UV)-curable photothermal conversion layer, and a joining layer are used, the curing process is sometimes inhibited to the extent that a sufficiently cured product cannot be obtained. Therefore, in the case where the photothermal conversion layer is, for example, ultraviolet-curable, in order to minimize the force required to separate the substrate from the support after irradiation and to prevent the abrasion of the photothermal conversion layer during grinding, the thickness of the photothermal conversion layer is preferably from about 0.3 to about 3 µm, more preferably from about 0.5 to about 2.0 µm.

Joining Layer

The joining layer is used for fixing the substrate to be ground to the support through a photothermal conversion layer. After the separation of the substrate and the support by the decomposition of the photothermal conversion layer, a substrate having the joining layer thereon is obtained. Therefore, the joining layer must be easily separated from the substrate, such as by peeling. Thus, the joining layer has an adhesive strength high enough to fix the substrate to the support yet low enough to permit separation from the substrate. Examples of the adhesive which can be used as the joining layer in the present invention include rubber-base adhesives obtained by dissolving rubber, elastomer or the like in a solvent, one-part thermosetting adhesives based on epoxy, urethane or the like, two-part thermosetting adhesives based on epoxy, urethane, acryl or the like, hot-melt adhesives, ultraviolet (UV)—or electron beam-curable adhesives based on acryl, epoxy or the like, and water dispersion-type adhesives. UV-curable adhesives obtained by adding a photopolymerization initiator and, if desired, additives to (1) an oligomer having a polymerizable vinyl group, such as urethane acrylate, epoxy acrylate or polyester acrylate, and/or (2) an acrylic or methacrylic monomer are suitably used. Examples of additives include a thickening agent, a plasticizer, a dispersant, a filler, a fire retardant and a heat stabilizing agent.

In particular, the substrate to be ground such as silicon wafer generally has asperities such as circuit patterns on one side. For the joining layer to fill in the asperities of the substrate to be ground and rendering the thickness of the joining layer uniform, the adhesive used for the joining layer is preferably in a liquid state during coating and laminating and preferably has a viscosity of less than 10,000 centipoise (cps) at the temperature (for example, 25° C.) of the coating and laminating operations. This liquid adhesive is preferably coated by a spin coating method among various methods described later. As such an adhesive, a UV-curable adhesive and a visible light-curable adhesive are particularly preferred, because the thickness of the joining layer can be made uniform and moreover, the processing speed is high for the above-mentioned reason.

The storage modulus of the adhesive is preferably 100 MPa or more at 25° C. and 10 MPa or more at 50° C. under the use conditions after removal of the solvent of the adhesive in the case of a solvent-type adhesive, after curing in the case of a curable adhesive, or after normal temperature solidification in the case of a hot-melt adhesive. With this elastic modulus, the substrate to be ground can be prevented from warping or distorting due to stress imposed during grinding and can be uniformly ground to an ultrathin substrate. The storage modulus or elastic modulus as used herein can, for example, be measured on an adhesive sample size of 22.7 mm×10 mm×50 µm in a tensile mode at a frequency of 1 Hz, a strain of 0.04% and a temperature ramp rate of 5° C./min. This storage modulus can be measured using SOLIDS ANALYZER RSA II (trade name) manufactured by Rheometrics, Inc.

As the joining layer, a double-faced adhesive tape shown in FIGS. 1(b) to (e) can also be used. In such a double-faced adhesive tape, a pressure-sensitive adhesive layer is usually provided on both surfaces of a backing material. Examples of useful pressure-sensitive adhesives include those mainly comprising acryl, urethane, natural rubber or the like, and those additionally containing a crosslinking agent. Among these, preferred is an adhesive comprising 2-ethylhexylacrylate or butyl acrylate as the main component. For the backing material, paper or a film of plastic or the like is used. Here, the backing must have sufficiently high flexibility so as to permit the separation of the joining layer from the substrate by peeling.

It is also found that in the case of grinding a substrate to an ultrathin thickness, a specific photocurable adhesive is preferably used. Grinding of a substrate to an ultrathin thickness of 50 µm or less sometimes causes problems such as intrusion of water into the interface between the substrate and the joining layer, edge chipping of the substrate or damage in the center portion of the substrate. To avoid these problems, the grinding is generally performed at a slower rate. This results in grinding times which are as much as twice as long as those employed for an ordinary finished thickness of 150 µm or more. This is done, for example, by reducing the rotation number of the grinding wheel so as to prevent damage. In general, an ultrathin semiconductor wafer is subjected to a polishing step of removing a damage layer (a layer which is damaged by the grinding and not a single crystal) remaining after the back surface grinding. In the grinding or polishing step, to avoid problems such as intrusion of water into the interface between the substrate and the joining layer, edge chipping of the substrate, or damage in the center portion of the substrate without sacrificing the grinding speed, the adhesive strength (cleavage mode, see FIG. 9 and the description below) of the joining layer to the substrate to be ground at least about 2.0 (N/3.5 cm$^2$) or more when measured as described later on in the Examples.

When the photocurable adhesive is cured on the substrate to be ground, the adhesion area is reduced due to curing shrinkage and the adhesive strength to the substrate is liable to decrease. In order to ensure the above-described adhesive strength, the photocurable adhesive is preferably an adhesive which can recover the adhesive strength under heating to a temperature higher than the glass transition temperature (Tg). Such an adhesive has a minimum storage modulus of $3.0 \times 10^7$ to $7.0 \times 10^7$ Pa as measured at a temperature of 25 to 180° C. If the minimum storage modulus is too high, a sufficiently large adhesive strength cannot be obtained and this may give rise to intrusion of water into the interface between the substrate and the joining layer, edge chipping of the substrate or damage in the center portion of the substrate. On the other hand, if the minimum storage modulus is excessively low, separation of the joining layer (adhesive layer) may be difficult after a heating step, such as lamination to a die bonding tape.

Furthermore, the storage modulus at a maximum achievable temperature at the interface of the substrate and the joining layer during grinding (usually from 40 to 70° C., for example 50° C.) is preferably $9.0 \times 10^7$ Pa or more, more preferably $3.0 \times 10^8$ Pa or more. With the storage modulus in this range, the pressing in the vertical direction by a grinding tool during the grinding is prevented from causing local deformation of the joining layer to an extent of damaging the substrate to be ground (silicon wafer).

As an example of a photocurable adhesive that satisfies all of these conditions, an adhesive where the total amount of bifunctional urethane (meth)acrylate oligomers having a molecular weight of 3,000 or more is 40 wt % or more and the total amount of bifunctional (meth)acryl monomers is 25 wt % or more is known and is suitably used. However, the adhesive is not particularly limited as long as it exhibits necessary properties (adhesive strength, functional property).

The thickness of the joining layer is not particularly limited as long as it can ensure the thickness uniformity required for the grinding of the substrate to be ground and the tear strength necessary for the peeling of the joining layer from the wafer after removing the support from the laminated body, and can sufficiently absorb the asperities on the substrate surface. The thickness of the joining layer is typically from about 10 to about 150 µm, preferably from about 25 to about 100 µm.

Other Useful Additives

Since the substrate to be ground of the laminated body of the present invention can be a wafer having formed thereon a circuit, the wafer circuit may be damaged by radiation energy such as a laser beam reaching the wafer through the light transmitting support, the photothermal conversion layer and the joining layer. To avoid such circuit damage, a light absorbing dye capable of absorbing light at the wavelength of the radiation energy or a light reflecting pigment capable of reflecting the light may be contained in any of the layers constituting the laminated body or may be contained in a layer separately provided between the photothermal conversion layer and the wafer. Examples of light absorbing dyes include dyes having an absorption peak in the vicinity of the wavelength of the laser beam used (for example, phthalocyanine-based dyes and cyanine-based dyes). Examples of light reflecting pigments include inorganic white pigments such as titanium oxide.

Additional Useful Layers

Figure 1F:
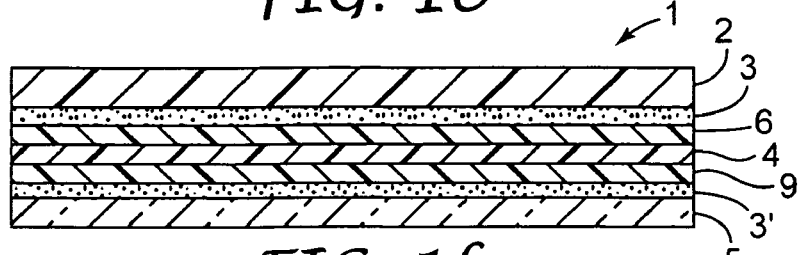

The laminated body of the present invention may comprise additional layers other than the substrate to be ground, the joining layer in contact with the substrate to be ground, the photothermal conversion layer and the light transmitting support. Examples of the additional layer include a first intermediate layer 6 provided, as shown in FIG. 1(f), between the joining layer 3 and the photothermal conversion layer 4, and/or a second intermediate layer 9 provided between the photothermal conversion layer 4 and the support 5. The second intermediate layer 9 is preferably joined to the support 5 through a joining layer 3' (for example, a pressure-sensitive adhesive).

In the case where the first intermediate layer 6 is provided, the laminated body 1 is separated at the photothermal conversion layer 4 after the irradiation and a laminated body of first intermediate layer 6/joining layer 3/substrate 2 is obtained. Therefore, the first intermediate layer 6 acts as a backing during the separation of the joining layer 3 from substrate 2 and enables the easy separation of the two. The first intermediate layer 6 is preferably a multilayer optical film. Also, the first intermediate layer 6 is preferably a film which selectively reflects the radiation energy used to enable the separation, such as YAG laser (near infrared wavelength light). This film is preferred because when the first intermediate layer 6 does not transmit but reflects radiation energy, the radiation energy is prevented from reaching the wafer surface, where circuitry is present, and this eliminates the possibility of damage to the circuitry. In the case of using a photocurable adhesive as the joining layer 3, a film having a sufficiently high transmittance for curing light such as ultraviolet light is preferred. Accordingly, the multilayer optical film is preferably transmissive to ultraviolet light and selectively reflects near infrared light. The preferred multilayer optical film which is transmissive to ultraviolet light and reflects near infrared light is available as 3M™ Solar Reflecting Film (3M Company, St. Paul, Minn.). The first intermediate layer 6 functions as a substrate for the removal of joining layer 3 from substrate 2 by peeling and therefore, preferably has a thickness of 20 µm or more, more preferably 30 µm or more, and a breaking strength of 20 MPa or more, more preferably 30 MPa or more, still more preferably 50 MPa or more.

In the case where the above-described second intermediate layer 9 is provided, a laminated body of second intermediate layer 9/joining layer 3'/light transmitting support 5 is obtained after the irradiation of the laminated body 1. Therefore, the second intermediate layer 9 acts as a backing during the separation of the joining layer 3' and support 5 and enables the easy separation of the two. As such, by providing a second intermediate layer, the photothermal conversion layer 4 or the joining layer 3' (pressure-sensitive adhesive) is prevented from remaining on the light transmitting support 5, and the support 5 can be easily recycled. In order to enable the removal of joining layer 3' from support 5 by peeling them apart after the laser irradiation and without rupturing, the second intermediate layer 9 preferably has a thickness of 20 µm or more, more preferably 30 µm or more, and a breaking strength of 20 MPa or more, more preferably 30 MPa or more, still more preferably 50 MPa or more. In some cases, the resin of the second intermediate layer 9 permeates into the photothermal conversion layer 4, such as when the second intermediate layer is coated as a mixture of photocurable oligomer and monomer and cured with UV (e.g., when the sheet is produced by coating photothermal conversion layer on the film substrate, coating the second intermediate layer on photothermal conversion layer and curing it, and coating the joining layer on the second intermediate layer). In such cases, in order to prevent re-adhering of the surface separated with a space formed by the laser irradiation, the Tg of the resin (in the case of a photocurable resin, the Tg of the cured resin) must be 40° C. or more.

Manufacturing the Laminated Body

In the manufacture of the laminated body, it is important to prevent undesirable foreign substances such as air from entering between layers. For example, if air enters between layers, the thickness uniformity of the laminated body is prevented and the substrate to be ground cannot be ground to a thin substrate. In the case of manufacturing a laminated body shown in FIG. 1(a), the following method, for example, may be considered. First, the precursor coating solution of the photothermal conversion layer is coated on the support by any one of the methods described above, dried and cured by irradiating with ultraviolet light or the like. Thereafter, the joining layer is coated on either one or both of the surface of the cured photothermal conversion layer and the surface of the substrate in the non-ground side. The photothermal conversion layer and the substrate are attached through the joining layer and then, the joining layer is cured, for example, by irradiating with ultraviolet light from the support side, whereby a laminated body can be formed. The formation of such a laminated body is preferably performed under vacuum to prevent air from entering between layers. This can be attained by, for example, by modifying a vacuum adhesion device such as that described in Japanese Unexamined Patent Publication (Kokai) No. 11-283279. In the case of manufacturing a laminated body as shown in FIGS. 1(b) to (e), the laminated body can be easily formed by laminating the substrate to be ground and the support using a double-faced tape previously formed in a usual manner. This is also preferably performed under vacuum similarly to the above-described case. The laminated body as shown in FIG. 1(f), where the joining layers 3 and 3' are pressure-sensitive adhesive layers, can be produced in the same manner as the laminated body of FIGS. 1(b) to (e) by forming a double-coated adhesive tape having a pressure-sensitive adhesive on both surfaces of first intermediate layer/photothermal conversion layer/second intermediate layer, and laminating a substrate to be ground and a support thereto. In this case the second intermediate layer is coated on the photothermal conversion layer directly and held with the joining layers 3' (a pressure-sensitive adhesive or a photocurable adhesive) to the support. In the case where the joining layers 3 and 3' are a photocurable adhesive, the laminated body can be produced in the same manner as the laminated body shown in FIG. 1(*a*). The vacuum adhesion device which can be used for forming a laminated body is described below.

The laminated body is preferably designed such that it is free from the invasion of water used during grinding of the substrate, has an adhesive strength between layers so as not to cause dropping off of the substrate, and has an abrasion resistance so as to prevent the photothermal conversion layer from being abraded by the water flow (slurry) containing dusts of the ground substrate.

Manufacturing the Thinned Substrate

A thinned substrate can be manufactured by the method comprising preparing a laminated body formed as above, grinding the substrate, to a desired thickness, applying radiation energy to the photothermal conversion layer through the light transmitting support to decompose the photothermal conversion layer and thereby to separate the ground substrate from the light transmitting support, and peeling the joining layer from the substrate.

In one aspect, the method of the present invention is described below by referring to the drawings. In the following, a laser beam is used as the radiation energy source and a silicon wafer is used as the substrate to be ground, however, the present invention is not limited thereto.

Figure 2A:
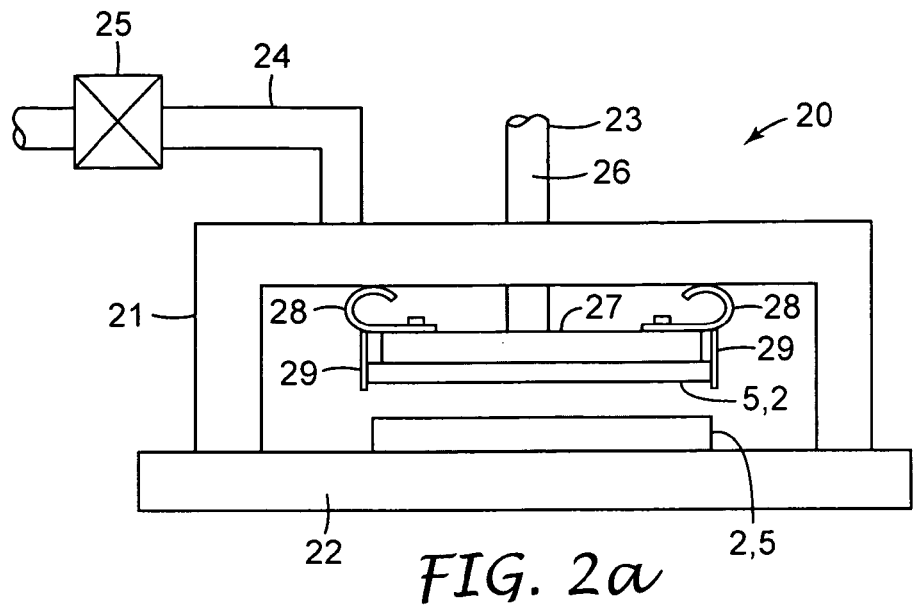
FIGS. 2(a) and (b) show cross-sectional views of a vacuum adhesion device useful in the present invention.
Figure 2B:
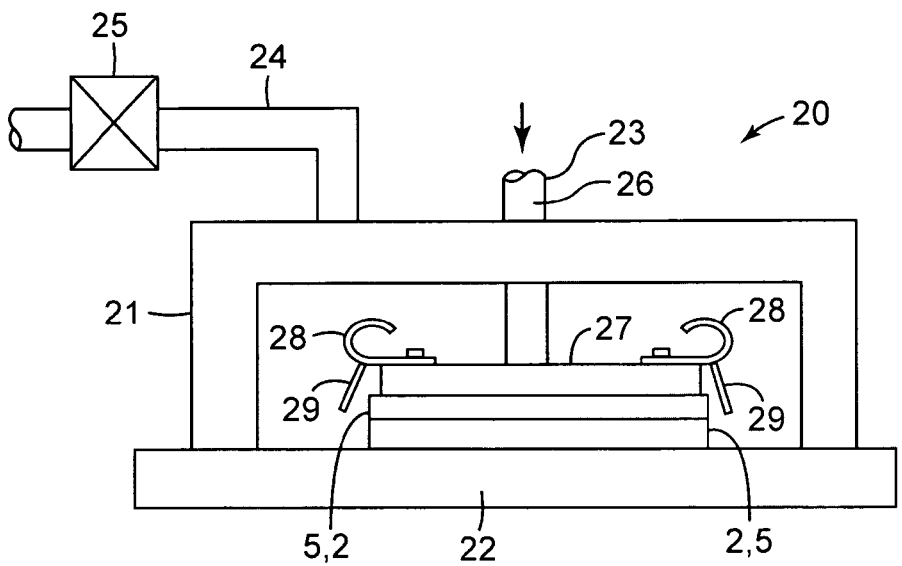

FIG. 2 shows a cross-sectional view of a vacuum adhesion device suitable for the production of the laminated body of one embodiment of the present invention. A vacuum adhesion device 20 comprises a vacuum chamber 21; a supporting part 22 provided in the vacuum chamber 21, on which either one of a substrate 2 to be ground (silicon wafer) or a support 5 is disposed; and holding/releasing means 23 provided in the vacuum chamber 21 and movable in the vertical direction at the upper portion of the supporting part 22, which holds the other one of the support 5 or the silicon wafer 2. The vacuum chamber 21 is connected to a pressure reducing device 25 via pipe 24, so that the pressure inside the vacuum chamber 21 can be reduced. The holding/releasing means 23 has a shaft 26 movable up and down in the vertical direction, a contact surface part 27 provided at the distal end of the shaft 26, leaf springs 28 provided in the periphery of the contact surface part 27, and holding claws 29 extending from each leaf spring 28. As shown in FIG. 2(*a*), when the leaf springs are in contact with the upper surface of the vacuum chamber 21, the leaf springs are compressed and the holding claws 29 are directed toward the vertical direction to hold the support 5 or the wafer 2 at peripheral edges. On the other hand, as shown in FIG. 2(*b*), when the shaft 26 is pressed down and the support 5 or the wafer 2 is in close proximity to the wafer 2 or the support 5 respectively disposed on the supporting part, the holding claws 29 are released together with the leaf springs 28 to superimpose the support 5 and the wafer 2.

Using this vacuum adhesion device 20, the laminated body can be manufactured as follows. First, as described above, a photothermal conversion layer is provided on a support 5. Separately, a wafer to be laminated is prepared. On either one or both of the wafer 2 and the photothermal conversion layer of the support 5, an adhesive for forming a joining layer is applied. The thus-prepared support 5 and wafer 2 are disposed in the vacuum chamber 21 of the vacuum adhesion device 20 as shown in FIG. 2(*a*), the pressure is reduced by the pressure reducing device, the shaft 26 is pressed down to laminate the wafer as shown in FIG. 2(*b*) and after opening to air, the adhesive is cured, if desired, to obtain a laminated body.

Figure 3:
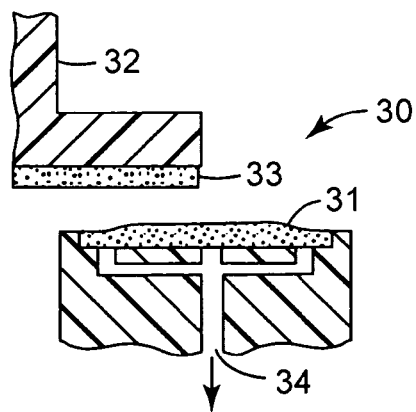
FIG. 3 is a partial cross-sectional view of a grinding device useful in the method of the present invention.
Figure 4A:
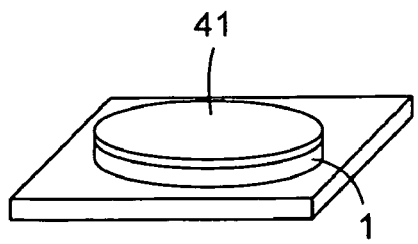
FIGS. 4(a), (a') and (b)-(e) show the steps of separating the support and peeling the joining layer.
Figure 4A:
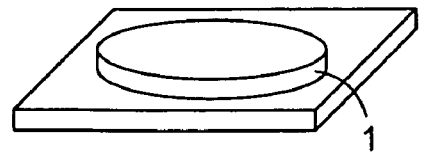
Figure 4B:
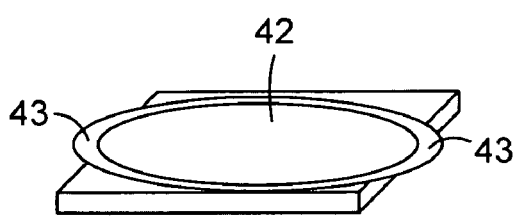
Figure 4C:
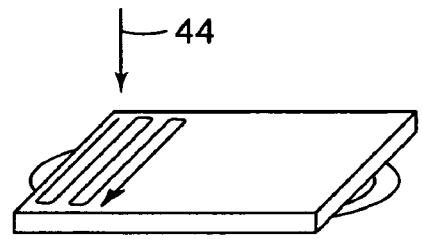
Figure 4D:
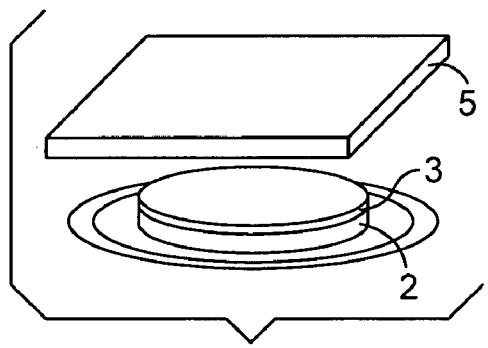
Figure 4E:
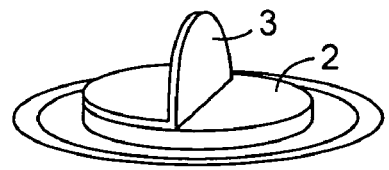

FIG. 3 shows a partial cross-sectional view of a grinding device useful in an embodiment of the invention. The grinding device 30 comprises a pedestal 31 and a grinding wheel 33 rotatably mounted on the bottom end of a spindle 32. A suction port 34 is provided beneath the pedestal 31 and the suction port 34 is connected to a pressure reducing device (not shown), whereby a material to be ground is suctioned and fixed on the pedestal 31 of the grinding device 30. The laminated body 1 of the present invention as shown in FIG. 1 is prepared and used as a material to be ground. The support side of the laminated body 1 is mounted on the pedestal 31 of the grinding device 30 and fixed by suction using a pressure reducing device. Thereafter, while feeding a fluid flow (such as water or any solution known useful in wafer grinding), the grinding wheel 33 under rotation is brought into contact with the laminated body 1, thereby performing the grinding. The grinding can be performed to an ultrathin level of 150 μm or less, preferably 50 μm or less, more preferably 25 μm or less.

After grinding to the desired level, the laminated body 1 is removed and conveyed to subsequent steps, where the separation of the wafer and the support by irradiation with a laser beam and the peeling of the joining layer from the wafer are performed. FIG. 4 shows a drawing of the steps of separating the support and peeling of the joining layer. First, by taking account of the final step of dicing, a die bonding tape 41 is disposed, if desired, on the ground surface of the wafer side of the laminated body 1 (FIG. 4(*a*)) or the die bonding tape 41 is not disposed (FIG. 4(*a'*)), and thereafter, a dicing tape 42 and a dicing frame 43 are disposed (FIG. 4(*b*)). Subsequently, a laser beam 44 is irradiated from the support side of the laminated body 1 (FIG. 4(*c*)). After the irradiation of the laser beam, the support 5 is picked up to separate the support 5 from the wafer 2 (FIG. 4(*d*)). Finally, the joining layer 3 is separated by peeling to obtain a thinned silicon wafer 2 (FIG. 4(*e*)).

Usually, a semiconductor wafer such as silicon wafer is subjected to chamfering called beveling so as to prevent edges from damage due to impact. That is, the corners at edge parts of a silicon wafer are rounded. When a liquid adhesive is used as the joining layer and coated by spin coating, the joining layer is spread to the edge parts and the adhesive is exposed to edge parts of the grinding surface. As a result, in disposing a dicing tape, not only the ground wafer but also the exposed adhesive come into contact with the pressure-sensitive adhesive of the dicing tape. When the adhesion of the dicing tape used is strong, the joining layer is sometimes difficult to separate. In such a case, it is preferred to previously remove a part of the exposed adhesive before disposing a dicing tape and a dicing frame. For the removal of the exposed adhesive at edge parts, using radiation energy or a $CO_2$ laser (wavelength of 10.6 μm) which the adhesive can sufficiently absorb is effective.

Figure 5:
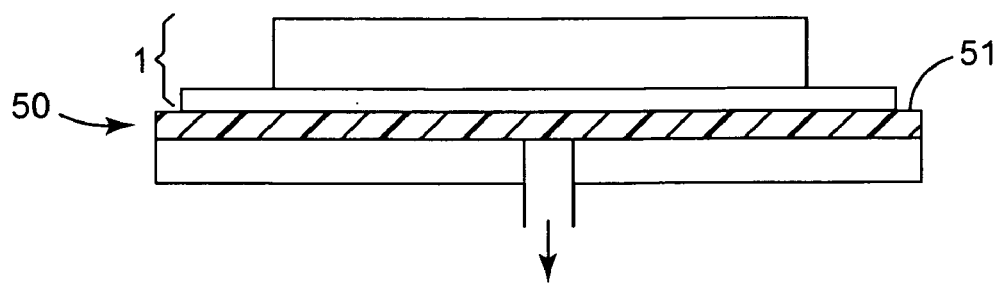
FIG. 5 is a cross-sectional view of a laminated body fixing device which can be used in the laser beam irradiation step.

FIG. 5 shows a cross-sectional view of a laminated body fixing device which can be used, for example, in the step of irradiating, such as with a laser beam in one aspect of the invention. The laminated body 1 is mounted on a fixing plate 51 such that the support comes as the upper surface with respect to the fixing device 50. The fixing plate 51 is made of a porous metal such as sintered metal or a metal having surface roughness. The pressure is reduced from the lower part of the fixing plate 51 by a vacuum device (not shown), whereby the laminated body 1 is fixed by suction onto the fixing plate 51. The vacuum suction force is preferably strong enough not to cause dropping in the subsequent steps of separating the support and peeling of the joining layer. A laser beam is used to irradiate the laminated body fixed in this manner. For emitting the laser beam, a laser beam source having an output high enough to cause decomposition of the heat decomposable resin in the photothermal conversion layer at the wavelength of light absorbed by the photothermal conversion layer is selected, so that a decomposition gas can be generated and the support and the wafer can be separated. For example, a YAG laser (wavelength of 1,064 nm), a second harmonic YAG laser (wavelength: 532 nm) and a semiconductor laser (wavelength: from 780 to 1,300 nm) can be used.

Figure 6A:
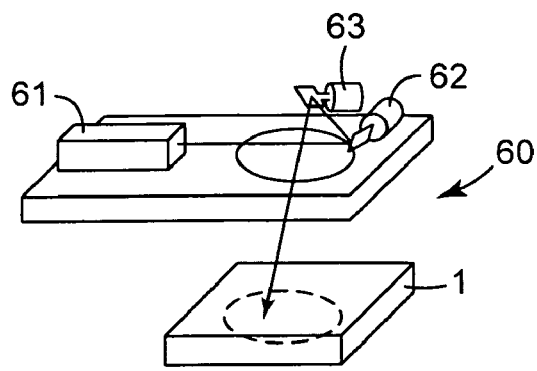
FIGS. 6(a)-(e) are perspective views of laser irradiation devices useful in the present invention.
Figure 6B:
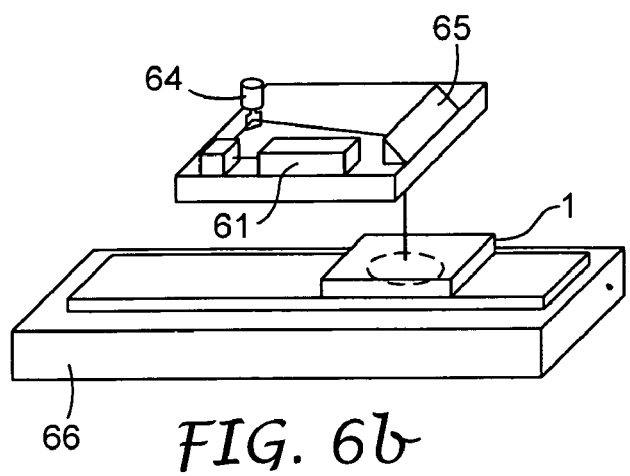
Figure 6C:
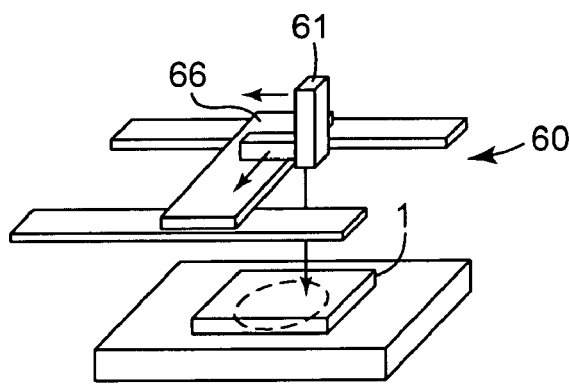
Figure 6D:
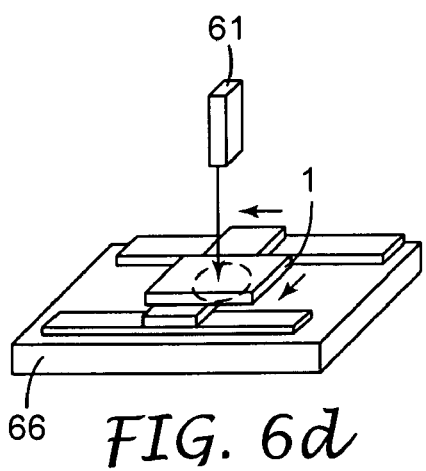
Figure 6E:
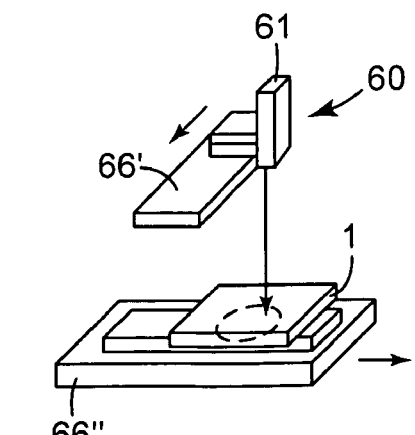

As the laser irradiation device, a device capable of scanning a laser beam to form a desired pattern on the irradiated surface and capable of setting the laser output and the beam moving speed is selected. Also, in order to stabilize the processing quality of the irradiated material (laminated body), a device having a large focus depth is selected. The focus depth varies depending on the dimensional precision in the design of device and is not particularly limited but the focus depth is preferably 30 µm or more. FIG. 6 shows a perspective view of a laser irradiation device which can be used in the present invention. The laser irradiation device 60 of FIG. 6(a) is equipped with a galvanometer having a biaxial configuration composed of the X axis and the Y axis and is designed such that a laser beam oscillated from a laser oscillator 61 is reflected by the Y axis galvanometer 62, further reflected by the X axis galvanometer 63 and irradiated on the laminated body 1 on the fixing plate. The irradiation position is determined by the directions of the galvanometers 62 and 63. The laser irradiation device 60 of FIG. 6(b) is equipped with a uniaxial galvanometer or a polygon mirror 64 and a stage 66 movable in the direction orthogonal to the scanning direction. A laser beam from the laser oscillator 61 is reflected by the galvanometer or polygon 64, further reflected by a hold mirror 65 and irradiated on the laminated body 1 on the movable stage 66. The irradiation position is determined by the direction of the galvanometer or polygon 64 and the position of the movable stage 66. In the device of FIG. 6(c), a laser oscillator 61 is mounted on a movable stage 66 which moves in the biaxial direction of X and Y, and a laser is irradiated on the entire surface of the laminated body 1. The device of FIG. 6(d) comprises a fixed laser oscillator 61 and a movable stage 66 which moves in the biaxial direction of X and Y. The device of FIG. 6(e) has a constitution such that a laser oscillator 61 is mounted on a movable stage 66' which can move in the uniaxial direction and a laminated body 1 is mounted on a movable stage 66" which can move in the direction orthogonal to the movable stage 66'.

Figure 6F:
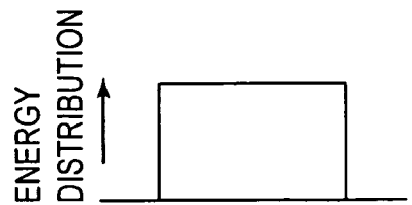
FIG. 6(f) is a drawing showing energy distribution of a top hat form.

When there is concern about damaging the wafer of the laminated body 1 by the laser irradiation, a top hat form (see FIG. 6(f)) having a steep energy distribution and very reduced leakage energy to the adjacent region is preferably formed. The beam form may be changed by any known method, for example, by (a) a method of deflecting the beam by an acousto-optic device, a method of forming a beam using refraction/diffraction, or (b) a method of cutting the broadening portion at both edges by using an aperture or a slit.

The laser irradiation energy is determined by the laser power, the beam scanning speed and the beam diameter. For example, the laser power that can be used is, but not limited to, from 0.3 to 100 watts (W), the scanning speed is from 0.1 to 40 meters/second (m/s), and the beam diameter is from 5 to 300 µm or more. In order to increase the speed of this step, the laser power is enhanced and thereby the scanning speed is increased. Since the number of scans can be further reduced as the beam diameter becomes larger, the beam diameter may be increased when the laser power is sufficiently high.

The heat decomposable resin in the photothermal conversion layer is decomposed by the laser irradiation to generate a gas which creates cracks inside the layer to separate the photothermal conversion layer itself. If air enters in between the cracks, re-adhesion of the cracks can be prevented. Therefore, in order to facilitate the entering of air, it is desirable to perform the beam scanning from the edge part of the laminated body to the interior of the laminated body.

As described above, the glass transition temperature (Tg) of the photothermal conversion layer is preferably room temperature (20° C.) or more. This is because the separated cracks may re-adhere to one another during the cooling of the decomposed resin and make the separation impossible. The re-adhesion is considered to occur due to the fact that the cracks of the photothermal conversion layer become attached with each other under the weight of the support. Therefore, the re-adhesion can be prevented when the irradiation process is contrived not to impose the weight of the support, for example, by performing the laser irradiation in the vertical direction from the lower part to the upper part (namely, by performing the laser irradiation in a configuration such that the support comes to the bottom side) or by inserting a hook between the wafer and the photothermal conversion layer from the edge part and lifting the layer.

To employ a laser beam from the edge part of the laminated body, a method of applying the laser beam while linearly reciprocating it from the edge part to the tangential direction of wafer or, alternatively, a method of spirally irradiating the laser beam from the edge part to the center like a phonograph record may be used.

Figure 7A:
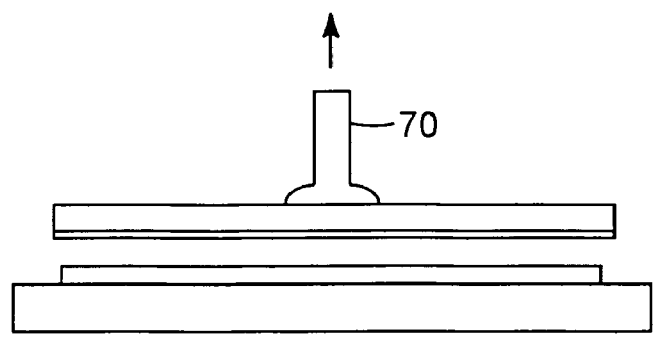
FIG. 7(a) is a schematic view of a pick-up used in the operation of separating wafer and support, wherein the pick-up is in the center of the support.
Figure 7B:
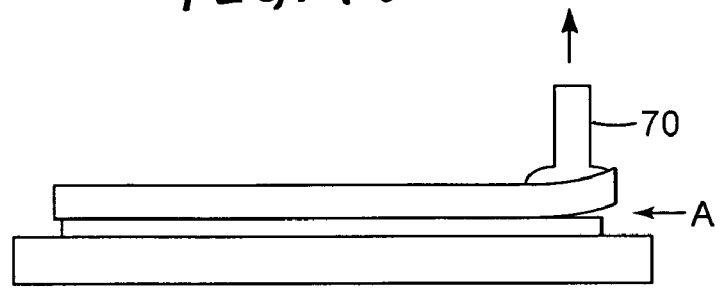
FIG. 7(b) is a schematic view of a pick-up used in the operation of separating wafer and support, wherein the pick-up is at the edge part of the support.

After the laser irradiation, the support is separated from the wafer and for this operation, a general pick-up using a vacuum is used. The pick-up is a cylindrical member connected to a vacuum device having a suction device at the distal end. FIG. 7 shows a schematic view of a pick-up for use in the separation operation of the wafer and the support. In the case of FIG. 7(a), the pick-up 70 is in the center of the support 5 and picked up in the vertical direction, thereby peeling off the support. Also, as shown in FIG. 7(b), the pick-up 70 is at the edge part of the support 5 and by peeling while blowing a compressed air (A) from the side to enter air between the wafer 2 and the support 5, the support can be more easily peeled off.

Figure 8:
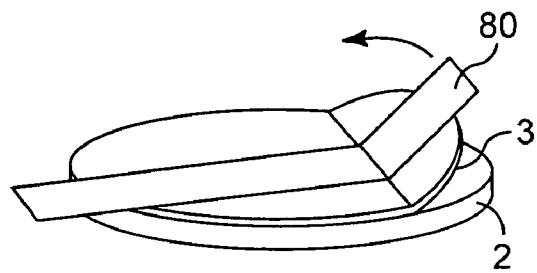
FIG. 8 is a schematic view showing how the joining layer is peeled from the wafer.

After removing the support, the joining layer on the wafer is removed. FIG. 8 is a schematic view showing how the joining layer is peeled. For the removal of the joining layer 3, preferably, an adhesive tape 80 for removing the joining layer, which can create a stronger adhesive bond with joining layer 3 than the adhesive bond between the wafer 2 and the joining layer 3, can be used. Such an adhesive tape 80 is placed to adhere onto the joining layer 3 and then peeled in the arrow direction, whereby the joining layer 3 is removed.

Finally, a thinned wafer remains in the state of being fixed to a dicing tape or a die frame with or without a die bonding tape. This wafer is diced in a usual manner, thereby completing a chip. However, the dicing may be performed before the laser irradiation. In such a case, it is also possible to perform the dicing step while leaving the wafer attached to the support, then subject only the diced region to the laser irradiation and separate the support only in the diced portion. The present invention may also be applied separately to a dicing step without using a dicing tape, by re-transferring through a joining layer the ground wafer onto a light transmitting support having provided thereon a photothermal conversion layer.

The present invention is effective, for example, in the following applications.

1. Laminated CSP (Chip Size Package) for High-Density Packaging

The present invention is useful, for example, with a device form called system-in-package where a plurality of Large Scale Integrated (LSI) devices and passive parts are housed in a single package to realize multifunction or high performance, and is called a stacked multi-chip package. According to the present invention, a wafer of 25 μm or less can be reliably manufactured in a high yield for these devices.

2. Through-Type CSP Requiring High Function and High-Speed Processing

In this device, the chips are connected by a through electrode, whereby the wiring length is shortened and the electrical properties are improved. To solve technical problems, such as formation of a through hole for forming a through electrode and embedding of copper in the through hole, the chip must be further reduced in the thickness. In the case of sequentially forming chips having such a configuration by using the laminated body of the present invention, an insulating film and a bump (electrode) must be formed on the back surface of the wafer and the laminated body needs resistance against heat and chemicals. Even in this case, when the above-described support, photothermal conversion layer and joining layer are selected, the present invention can be effectively applied.

3. Ultrathin Compound Semiconductor (e.g. GaAs) Improved in Heat Radiation Efficiency, Electrical Properties and Stability Compound semiconductors such as gallium arsenide are being used for high-performance discrete chips, laser diode and the like because of their advantageous electrical properties (high electron mobility, direct transition-type band structure) over silicon. Using the laminated body of the present invention and thereby reducing the thickness of the chip increases the heat dissipation efficiency thereof and improves performance. At present, the grinding operation for thickness reduction and the formation of an electrode are performed by joining a semiconductor wafer to a glass substrate as the support using a grease or a resist material. Therefore, the joining material must be dissolved by a solvent for separating the wafer from the glass substrate after the completion of processing. This is accompanied with problems that the separation requires more than several days time and the waste solution must be treated. These problems can be solved when the laminated body of the present invention is used.

4. Application to Large Wafer for Improving Productivity

In the case of a large wafer (for example, a 12 inch-diameter silicon wafer), it is very important to separate the wafer and the support easily. The separation can be easily performed when the laminated body of the present invention is used, and therefore, the present invention can be applied also to this field.

5. Ultrathin Rock Crystal Wafer

In the field of rock crystal wafer, the thickness reduction of a wafer is required to increase the oscillation frequency. The separation can be easily performed when the laminated body of the present invention is used, and therefore, the present invention can be applied also to this field.

EXAMPLES

The present invention is described in greater detail below by referring to Examples.

First, by using various conditions of laser irradiation, characteristics preferred for separation of the support and the wafer was evaluated. Since the property for separation depends on the degree of decomposition of the photothermal conversion layer by laser irradiation, a glass substrate was used in place of the ground wafer. As the light transmitting support, a glass substrate of 127 millimeters (mm)×94 mm×0.7 mm was used, and in place of the wafer, the same glass substrate as above was used. A 10% solution (in propylene glycol methylether acetate solvent) of a photothermal conversion layer precursor having the composition shown in Table 1 below was coated on the glass substrate by spin coating.

TABLE 1

| Photothermal Conversion Layer | |
|---|---|
| | Solid Content Ratio |
| EC600JD | 15.91% |
| Solasperse 5000 | 0.80% |
| Disperbyk 161 | 12.78% |
| UR8300 | 39.81% |
| Ebecryl EB629 | 11.64% |
| TMPTA-N | 11.64% |
| Irgacure 369 | 6.47% |
| Irgacure 184 | 0.96% |
| Total | 100.00% |

EC600JD (Ketjen Black International Co.): carbon black, average particle size 30 nm; Solsperse 5000 (Zeneca Co., Ltd.): dispersion aid; Disperbyk 161 (BYK Chemie Japan Co., Ltd.): dispersant (30% in butyl acetate); UR8300 (Toyobo Co., Ltd.): urethane modified polyester resin (30% in toluene/methyl ethyl ketone), MW=30000, Tg=23° C., strength at breakage 400 kg/cm2, elongation at break 500%; Ebecryl EB629 (Daicel UCB Co. Ltd.): novolak epoxy acrylate diluted 33% with a monomer (TMPTA), oligomer MW=550.

TMPTA-N (Daicel UCB Co. Ltd.): trimethylolpropane triacrylate; Irgacure 369 (Ciba Specialty Chemicals K.K.): 2-benzyl-2-N,N-dimethylamino-1-(4-morpholinophenyl)-1-butanone; and Irgacure 184 (Ciba Specialty Chemicals K.K.): 1-hydroxycyclohexyl phenyl ketone.

This was dried by heating (80° C., 2 min) and then cured by ultraviolet (UV) irradiation to form a photothermal conversion layer on the support. A joining layer precursor having the composition shown in Table 2 below was coated dropwise on another glass substrate. These substrates were laminated to each other and UV was irradiated thereon to cure the joining layer precursor, thereby obtaining a laminated body.

TABLE 2

| Joining layer | |
|---|---|
| | Solid Content Ratio |
| UV-6100B | 57.10% |
| HDODA | 38.10% |
| Darocure1173 | 4.80% |
| Total | 100.00% |

UV-6100B (Nippon Synthetic Chemical Industry Co., Ltd): acrylated urethane oligomer, MW=6700, Tg 0° C. after UV cure; HDODA (Daicel UCB): 1,6-hexanediol diacrylate; Darocurel 173 (Ciba Specialty Chems.): 2-hydroxy-2-methyl-1-phenylpropan-1-one.

This laminated body had a configuration of glass substrate/photothermal conversion layer/joining layer/glass substrate, the thickness of the photothermal conversion layer was 0.9 µm and the thickness of the joining layer was 100 µm. This laminated body was disposed on a fixing plate of a laminated body fixing device as shown in FIG. 4 and the pressure was reduced from the lower side by a vacuum device to fix the laminated body by suction on the fixing plate. As a laser beam source for the radiation energy, a YAG laser (wavelength: 1,064 nm) was used. The laser output was varied in the range from 0.52 to 8.00 W, the beam diameter and the scanning pitch were the same and were varied in the range from 90 to 200 µm, the laser scanning speed was varied in the range from 0.2 to 5 m/s, the laser beam was applied by linearly reciprocating it from the edge part of the laminated body, and the laser beam was irradiated over the entire surface of the laminated body.

A pressure-sensitive adhesive tape (SCOTCH™ pressure-sensitive adhesive tape available as #3305 from 3M Company, St. Paul, Minn.) was attached to the glass substrate of the laminated body thus irradiated with a laser beam, and then picked up.

By this preliminary test, it was found that the glass substrates can be separated in good condition when the laser output is 6.0 to 8.0 W, the beam diameter and the scanning pitch is 100 to 200 µm, and the laser scanning speed is 0.2 to 2.0 m/s.

Example 1

A glass substrate of 220 mm (diameter)×1.0 mm (thickness) was used as the light permeable support, and a silicon wafer of 200 mm (diameter)×750 µm (thickness) was used as the wafer. A 10% solution (in propylene glycol methylether acetate solvent) of a photothermal conversion layer precursor having the composition shown in Table 1 above was coated on the glass substrate by spin coating. This was dried by heating and then cured by ultraviolet (UV) irradiation to form a photothermal conversion layer on the support. A joining layer precursor having the composition shown in Table 2 above was coated on the wafer similarly by spin coating. The glass substrate and the wafer were laminated to each other in a vacuum adhesion device as shown in FIG. 2 and thereon, was irradiated with UV light to cure the joining layer precursor, thereby obtaining a laminated body. This laminated body had a configuration of glass substrate/photothermal conversion layer/joining layer/silicon wafer, the thickness of the photothermal conversion layer was 0.9 µm, the thickness of the joining layer was 100 µm, and the adhesion area was 314 cm$^2$.

The laminated body obtained was disposed on a grinding device as shown in FIG. 3 and while feeding a water flow the grinding wheel under rotation was brought into contact with the laminated body, thereby performing the grinding. The grinding was performed to provide a wafer thickness of 50 µm. A dicing tape and a dicing frame were then disposed on the ground surface of the wafer and the laminated body was conveyed onto the fixing plate of a laminated body fixing device as shown in FIG. 5, where the pressure was reduced from the lower side by a vacuum device to thereby fix the laminated body by suction on the fixing plate.

Based on the results in the preliminary test above, the laser irradiation was performed using a YAG laser (wavelength: 1,064 nm) where the laser output was 6.0 W, the beam diameter and the scanning pitch each was 100 µm, and the laser scanning speed was 1.0 m/s. The laser beam irradiated the laminated body by linearly reciprocating from the edge part of the laminated body to the tangential direction. In this manner the entire surface of the laminated body irradiated. A suction device was fixed to the glass plate of the irradiated laminated body which was then was picked up, whereby the glass plate was easily separated from the wafer and a wafer having a joining layer thereon was obtained.

For peeling the joining layer from the wafer, a pressure-sensitive adhesive tape (SCOTCH™ #3305 Wafer De-taping Tape from 3M) was attached to the surface of the joining layer and peeled back in the direction of 180°, whereby a silicon wafer having a thickness of 50 µm was obtained without damaging the wafer.

Example 2

In this Example, the test was performed in the same manner as in Example 1 except for the following modifications. As the photothermal conversion layer precursor, a 20% solution (in propylene glycol methylether acetate) having the composition at a solid content ratio shown in Table 3 below was used. Furthermore, in order to prevent re-adhesion due to the weight of the glass substrate during laser irradiation, an L-shaped hook was inserted into the edge part of the glass substrate and hung up with a spring, whereby re-adhesion due to the weight of the glass substrate during laser beam irradiation was prevented. Similarly to Example 1, a silicon wafer having a thickness of 50 µm could be obtained without damaging the wafer.

TABLE 3

| Photothermal Conversion Layer | |
|---|---|
| | Solid Content Ratio |
| Raven 760 | 27.64% |
| Disperbyk 161 | 13.82% |
| Ebecryl 8804 | 50.49% |
| Irgacure 369 | 7.00% |
| Irgacure 184 | 1.05% |
| Total | 100.00% |

Raven 760 (Columbian Carbon Japan Ltd.): carbon black; Disperbyk 161 (BYK Chemie): dispersant (30% in butyl acetate); Ebecryl 8804 (Daicel UCB): Aliphatic urethane diacrylate, MW=1400 (30% in toluene); Irgacure 369 (Ciba Specialty Chemicals K.K.): 2-benzyl-2-N,N-dimethylamino-1-(4-morpholinophenyl)-1-butanone; Irgacure 184 (also from Ciba): 1-hydroxycyclohexyl phenyl ketone.

Example 3

In this Example, the test was performed in the same manner as in Example 2 except that a 10% solution (in propylene glycol methylether acetate) having the composition at a solid content ratio shown in Table 4 below was used as the photothermal conversion layer precursor. This photothermal conversion layer precursor is a polymer solution containing carbon black and therefore, the photothermal conversion layer was formed only by drying.

TABLE 4

| Photothermal Conversion Layer | |
|---|---|
| | Solid Content Ratio |
| Raven 760 | 30.06% |
| Disperbyk 161 | 15.03% |
| UR8300 | 54.91% |
| Total | 100.00% |

Raven 760 carbon black; Disperbyk 161 dispersant; UR8300 polyurethane polyester.

A silicon wafer having a thickness of 50 μm could be obtained without damaging the wafer by the same operation similarly to Example 1.

Comparative Example 1

A test was performed in the same manner as in Example 1 except that a laminated body consisting of silicon wafer/pressure-sensitive adhesive tape/glass substrate was prepared using no photothermal conversion layer and using, in place of the joining layer, a double-faced pressure-sensitive adhesive tape (SCOTCH™ #9415 high tack/low tack), with the lower tack adhesive in contact with the wafer. The silicon wafer could not be peeled.

Examples 4 to 10

In the following, tests were performed in the same manner as in Examples 1 to 3 by variously changing the composition and thickness of the photothermal conversion layer and using an adhesive (high elastic modulus-type adhesive) having the same composition as used in Examples 1 to 3 or an adhesive (low elastic modulus-type adhesive) having the following composition. The thickness of the joining layer was 50 μm. The silicon wafer was ground to 25 μm. The composition and thickness of the photothermal conversion layer and the composition of the joining layer in each Example are shown in Tables 5 and 6. In Examples 4 to 6, silica was incorporated as a transparent filler.

TABLE 5

|  | Weight | Volume |
|---|---|---|
| Photothermal Conversion Layer A (containing silica) | | |
| Black Pearls 130 | 25.0% | 18.6% |
| AEROSIL 380 | 22.0% | 13.8% |
| Disperbyk 161 | 7.5% | 9.4% |
| Joncryl 690 | 45.5% | 58.3% |
| Total | 100.0% | 100.0% |
| Photothermal Conversion Layer B (containing silica) | | |
| Black Pearls 130 | 25.0% | 17.9% |
| AEROSIL 380 | 16.5% | 10.0% |
| Disperbyk 161 | 7.5% | 9.0% |
| Joncryl 690 | 51.0% | 63.1% |
| Total | 100.0% | 100.0% |
| Photothermal Conversion Layer C (containing silica) | | |
| Black Pearls 130 | 25.0% | 17.3% |
| AEROSIL 380 | 11.0% | 6.4% |
| Disperbyk 161 | 7.5% | 8.7% |
| Joncryl 690 | 56.5% | 67.5% |
| Total | 100.0% | 100.0% |
| Photothermal Conversion Layer D | | |
| Black Pearls 130 | 65.0% | 52.4% |
| Disperbyk 161 | 32.5% | 26.5% |
| Joncryl 690 | 2.5% | 21.1% |
| Total | 100.0% | 100.0% |
| Photothermal Conversion Layer E | | |
| Black Pearls 130 | 45.0% | 32.4% |
| Disperbyk 161 | 22.5% | 16.3% |
| Joncryl 690 | 32.5% | 51.3% |
| Total | 100.0% | 100.0% |
| Joining Layer A (low elastic modulus) | | |
| UV 6100B | 38.1% | |
| HDODA | 25.4% | |
| HOA-MS | 31.7% | |
| Irgacure 369 | 4.8% | |
| Total | 100.0% | |
| Joining Layer B (high elastic modulus) | | |
| UV 6100B | 57.1% | |
| HDODA | 38.1% | |
| Irgacure 369 | 4.8% | |
| Total | 100.0% | |

Photothermal Conversion Layer Materials:

Black Pearls 130 (Cabot Corporation) carbon black; EC600JD carbon black; AEROSIL 380 (Nippon Aerosil Co.) silica filler; Joncryl 690 (Johnson Polymer Co.): polyacrylate resin, acid number=240, MW=15500, Tg=102° C.; Disperbyk 161 (BYK Chemie Japan Co., Ltd): dispersant; Solsperse 5000 (Zeneca Co., Ltd): dispersant Joining Layer Materials:

UV-6100B (The Nippon Synthetic Chemical Industry Co., Ltd): acrylated urethane oligomer, MW=6700, Tg 0° C. after UV cure; HDODA (Daicel UCB Company Ltd.): 1,6-hexanediol diacrylate; HOA-MS (Kyoeisha Chemical Co., Ltd) 2-acryloyloxy ethylsuccinic acid; Irgacure 369 (Ciba Specialty Chemicals K.K.) 2-benzyl-2-N,N-dimethylamino-1-(4-morpholinophenyl)-1-butanone.

TABLE 6

|  | Photothermal Conversion Layer | |
|---|---|---|
| Example | Composition | Thickness (μm) |
| Example 4 | A (containing silica) | 0.9 |
| Example 5 | B (containing silica) | 0.9 |
| Example 6 | C (containing silica) | 0.9 |
| Example 7 | D | 0.9 |
| Example 8 | D | 0.3 |
| Example 9 | E | 0.9 |
| Example 10 | E | 0.5 |

In each Example, two kinds of samples, one using a high elastic modulus adhesive as a joining layer and another using a low elastic modulus adhesive as a joining layer, were prepared.

In the tests, the separation of the wafer and the glass substrate was performed through the procedure described in Example 1. The test results are shown in Table 7 below.

TABLE 7

Separation Force for Laminated Body from Glass

| | Photothermal Conversion Layer | | | | | Force at the separating of Glass (N/314 cm$^2$) | |
|---|---|---|---|---|---|---|---|
| | Amount of filler | | | | | | |
| Example | (light absorbing agent/transparent filler) | FVC | TFVC*[4] | FVC/TFVC | Thickness (μm) | UV Transmittance*[1] | High Elastic Modulus-Type Joining Layer*[2] | Low Elastic Modulus-Type Joining Layer*[3] |
| 4 | carbon/silica | 32.4% | 28.4% | 114.1% | 0.9 | 2.05% | 2.0 | 5.6 |
| 5 | carbon/silica | 27.9% | 30.0% | 92.9% | 0.9 | 2.05% | 1.6 | 28.0 |
| 6 | carbon/silica | 23.7% | 32.5% | 73.1% | 0.9 | 2.05% | 2.4 | >50*[5] |
| 7 | Carbon | 52.6% | 43.9% | 119.7% | 0.9 | 0.04% | 3.2 | 0.4 |
| 8 | Carbon | 52.6% | 43.9% | 119.7% | 0.3 | 2.05% | 2.0 | >50*[5] |
| 9 | Carbon | 32.4% | 43.9% | 73.8% | 0.9 | 0.46% | 3.2 | >50*[5] |
| 10 | Carbon | 32.4% | 43.9% | 73.8% | 0.5 | 2.05% | 6.4 | >50*[5] |

*[1]Measured value at a wavelength of 365 nm.
*[2]Elastic modulus at 25° C. is 320 MPa.
*[3]Elastic modulus at 25° C. is 10 MPa.
*[4]FVC (filler volume concentration); TFVC (top filler volume concentration) which can be determined from the void volume of filler in the dry state using the amount of liquid (oil absorption amount) necessary for filling the filler voids as described above.
*[5]The wafer and the support can be easily separated by using a re-adhesion preventing mechanism.

As seen above, when a high elastic modulus-type joining layer was used, the glass substrate and the 25-μm wafer could be easily separated in all of Examples 4 to 10. When a low elastic modulus-type joining layer was used, the glass substrate and the wafer could not be easily separated in Examples 6 and 8 to 10 where FVC/TFVC was 80% or less. In Example 8, the FVC/TFVC was 80% or more but since the thickness of the photothermal conversion layer was low (0.3 μm), re-adhesion occurred due to local exposure of the joining layer to the separation surface and a large force was necessary. In Examples 6 and 8 to 10, the test samples were again produced and tested in the same manner as in Examples 2 and 3 by using a re-adhesion preventing mechanism (hanging up mechanism using an L-shaped hook and a spring) as described in Examples 2 and 3. In this case, the glass substrate and the 25-μm wafer could be easily separated. In Examples 4 and 5 where not only carbon black but also silica were used, even if FVC/TFVC was 80% or more, an ultraviolet (365 nm) transmittance of about 2% could be ensured and the joining layer using a UV-curable adhesive could be cured within a short time.

Examples 11 to 14

Joining Layer Preferred in Some Embodiments

In these examples, a laminated body of the present invention was produced using materials in the compositions for the photothermal conversion layer and the adhesive shown in Tables below.

TABLE 8

| Chemical Name | Trade Name | Weight Percentage |
|---|---|---|
| Adhesive Layer 1 | | |
| Urethane acrylate | UV7000B | 28.6% |
| Urethane acrylate | UV6100B | 28.6% |
| 1,6-Hexanediol diacrylate | 1,6-HX-A | 38.1% |
| Photoreaction initiator | Irgacure 369 | 4.8% |
| Total | | 100.0% |

TABLE 8-continued

| Chemical Name | Trade Name | Weight Percentage |
|---|---|---|
| Adhesive Layer 2 | | |
| Urethane acrylate | UV7000B | 47.6% |
| Dicyclopentanyl acrylate | FA513A | 19.0% |
| 1-6-Hexanediol diacrylate | 1,6-HX-A | 28.6% |
| Photoreaction initiator | Irgacure 369 | 4.8% |
| Total | | 100.0% |

TABLE 9

| Chemical Name | Trade Name | Weight Percentage |
|---|---|---|
| Adhesive Layer 3 | | |
| Urethane acrylate | UV6100B | 57.1% |
| 1-6-Hexanediol diacrylate | 1,6-HX-A | 38.1% |
| Photoreaction initiator | Irgacure 369 | 4.8% |
| Total | | 100.0% |

TABLE 10

| Chemical Name | Trade Name | Weight Percentage |
|---|---|---|
| Photothermal Conversion Layer | | |
| Carbon black | Sevacarb | 25.0% |
| Silica | A200 | 32.5% |
| Dispersant | Disperbyk 16 | 7.5% |
| Acryl resin | Joncryl 690 | 35.0% |
| Total | | 100.0% |

Adhesive Materials:

UV-6100B (The Nippon Synthetic Chemical Industry Co., Ltd.) Acrylated urethane oligomer, MW=6700, Tg after UV-cure 0 C and UV-7000B (also Nippon Synthetic Chem.) Acrylated urethane oligomer, MW=3500, Tg 52° after UV-cure; 1.6-HX-A (Kyoeisha Chemical Co., Ltd.); FA513A (Hitachi Chemical Co., Ltd.); HOA-MS (Kyoeisha Chemical Co., Ltd.); DCPA (Kyoeisha Chemical Co., Ltd.); Irgacure 369 (Ciba Specialty Chemicals K.K.)

Photothermal Conversion Layer Materials:

Sevacarb (Columbian Carbon Japan Ltd.); Aerosil 200 (Nippon Aerosil Co.); Joncryl 690 (Johnson Polymer Co.); Disperbyk 161 (BYK Chemie Japan Co., Ltd.)

Adhesives 1 to 3 were measured for storage modulus using a sample having a size of 22.7 mm×10 mm×50 µm in a tensile mode at a frequency of 1 Hz, a strain of 0.04% and a temperature ramp rate of 5° C./min using SOLIDS ANALYZER RSA II from Rheometrics, Inc. The results are shown in Table 11. In the Table, an elastic modulus at 50° C. is shown assuming that the maximum temperature encountered during the grinding is 50° C. Furthermore, a minimum elastic modulus measured at 25 to 180° C. is also shown.

Figure 9:
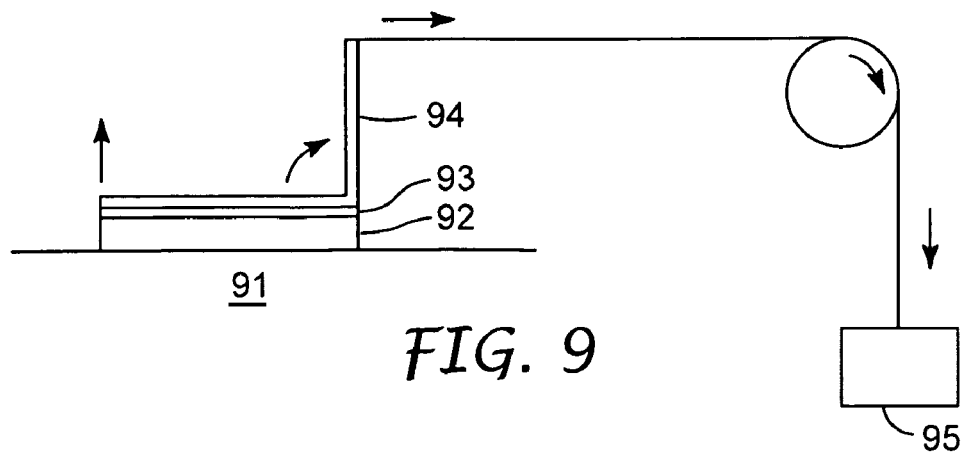
FIG. 9 is a schematic view of an apparatus for measuring the adhesive strength of the joining layer.

To confirm the adhesive bond strength as the joining layer, each adhesive was measured for bond strength (cleavage mode) by the following method. As shown in FIG. 9, a silicon wafer 92 was fixed on a horizontal supporting table 91 through a strong pressure-sensitive adhesive double-coated tape. On the silicon wafer 92, a joining layer (Adhesive 1) was coated to an area of 3.5 $cm^2$, dried and photo-cured to obtain a joining layer 93 having a thickness of 50 µm. To the cured joining layer 93, an L-shaped measuring jig 94 having a contact area of 3.5 $cm^2$ was bonded through a pressure-sensitive adhesive double-coated tape. A wire was connected to the vertical end part of the L-shaped measuring jig 94, a weight 95 was hung to apply the tensile force in the horizontal direction and the weight was moved at a tensile speed of 20 mm/min. The load at breaking is shown as an adhesive bond strength (cleavage mode) in Table 11. Furthermore, a preliminary heat treatment (140° C., 3 minutes) for recovering the adhesive strength was performed. The adhesive strength after the preliminary heat treatment is shown together in Table 11.

Example 11

A glass substrate having coated thereon a photothermal conversion layer was laminated with a silicon wafer through Adhesive 1 having a thickness of 50 µm and cured with ultraviolet light. The adhesion area was 314 $cm^2$. The wafer surface of the laminated sample was ground to provide a wafer thickness of 25 µm using a grinder while supplying grinding water and then the damage layer (about 2 µm) was removed by a dry polishing device. Simulating thermal press-bonding with a die bonding tape, the obtained sample was held on a hot plate at 180° C. for 3 minutes. Furthermore, laser irradiation was carried out from the glass side to remove the glass substrate and then, the adhesive was removed by peeling. The grinding conditions were as follows.

(1) Grinding Device: Model DFG850E Manufactured by DISCO
(2) Grinding Conditions:

|  | Coarse Grinding | Finish Grinding |
|---|---|---|
| Wafer thickness | 750 to 60 µm | 60 to 25 µm |
| Grinding Wheel No. (JIS#) | 380 | 2000 |
| Rotations per minute (rpm) of grinding wheel | 4800 | 5500 |

Example 12

A test was performed by the same procedure as in Example 11 except that Adhesive 2 was used and after the lamination, the sample before grinding was held in an oven at 140° C. for 3 minutes as a preliminary heat treatment.

Example 13

A test was performed by the same procedure as in Example 11 except that Adhesive 3 was used and the adhesive thickness was changed to 25 µm.

Example 14

A test was performed by the same procedure as in Example 11 except that Adhesive 3 was used and the grinding finish thickness of wafer was changed to 50 µm.

TABLE 11

| Example | Adhesive | Adhesive Thickness (µm) | Thickness of Wafer After Grinding (µm) | Elastic Modulus at 50° C. (Pa) | Minimum Elastic Modulus at 25 to 180° C. (Pa) | Initial Adhesive Strength (N/3.5 $cm^2$) | Adhesive Strength after Preliminary Heat Treatment (N/3.5 $cm^2$)* | Trouble during Grinding | Separation Failure after Heat Treatment |
|---|---|---|---|---|---|---|---|---|---|
| 11 | 1 | 50 | 25 | 3.8E+08 | 6.2E+07 | 2.6 | — | none | none |
| 12 | 2 | 50 | 25 | 1.1E+09 | 4.2E+07 | 1.8 | 3.0 | none | none |
| 13 | 3 | 25 | 25 | 9.4E+07 | 4.8E+07 | 3.1 | — | none | none |
| 14 | 3 | 50 | 50 | 9.4E+07 | 4.8E+07 | 3.1 | — | none | none |

*Preliminary heat treatment (140° C., 3 minutes)

As apparent from Table 11, even when the grinding was performed under the same conditions as in the ordinary grinding to 150 µm, troubles such as edge chipping during grinding or intrusion of water into the interface between the wafer and the joining layer were not brought about. A sufficiently high adhesive strength was obtained after the preliminary heat treatment and this was accompanied without the problem of being unable to separate the joining layer from the wafer due to increase in the adhesive strength of the joining layer after the preliminary heat treatment. This reveals that also in the removal (for example, a chemical etching method with chemicals, a CMP method of mechanically and chemically performing the polishing using a slurry, or a dry polishing method of performing the polishing without using chemicals at all) of the damage layer (a layer which is damaged by the grinding and not a single crystal) remaining on the wafer after grinding, a phenomenon of edge chipping or stripping does not occur.

Examples 15 and 16

Laminated Body Containing Additional Layers

In these Examples, a laminated body containing a first intermediate layer and a second intermediate layer was produced.

The following were used as the photothermal conversion layer, the second intermediate layer, the pressure-sensitive adhesive, the photocurable adhesive, the light transmitting support (glass substrate) and the substrate to be ground.

TABLE 12

| Photothermal Conversion Layer | | |
| --- | --- | --- |
| Chemical Name | Trade Name | Weight Percentage |
| Carbon black | Sevacarb | 25.0% |
| Silica | A200 | 32.5% |
| dispersant | Disperbyk 16 | 7.5% |
| Acryl resin | Joncryl 690 | 35.0% |
| Total | | 100.0% |

TABLE 13

| Second Intermediate Layer | | |
| --- | --- | --- |
| Chemical Name | Trade Name | Weight Percentage |
| Urethane acrylate | UV7000B | 47.6% |
| Dicyclopentanyl acrylate | FA513A | 47.6% |
| Photoreaction initiator | Irgacure 369 | 4.8% |
| Total | | 100.0% |

TABLE 14

| Pressure-Sensitive Adhesive | | |
| --- | --- | --- |
| Chemical Name | Trade Name | Weight Percentage |
| Polyurethane polyester | UR8700 | 25.0% |
| Polyurethane polyester | UR3200 | 75.0% |
| Total | | 100.0% |

Glass Substrate: Tenpax Heat-Resistance Glass

TABLE 15

| Photocurable Adhesive | | |
| --- | --- | --- |
| Chemical Name | Trade Name | Weight Percentage |
| Urethane acrylate | UV6100B | 57.1% |
| 1,6-Hexanediol diacrylate | 1.6-HX-A | 38.1% |
| Photoreaction initiator | Irgacure 369 | 4.8% |
| Total | | 100.0% |

Material to be Ground: Silicon wafer with a thickness of 750 µm.

Raw (Precursor) Materials:
Sevacarb (Columbian Carbon Japan Ltd.); Aerosil 200 (Nippon Aerosil Co.); Disperbyk 161 (BYK Chemie Japan Co., Ltd.); Joncryl 690 (Johnson Polymer Co.); UV7000B, UV6100B (The Nippon Synthetic Chemical Industry Co., Ltd.); FA513A (Hitachi Chemical Co., Ltd.); 1.6-HX-A (Kyoeisha Chemical Co., Ltd.); Irgacure 369 (Ciba Specialty Chemicals K.K.); UR8700:Urethane modified polyester resin, MW=32000, Tg=−22° C. Strength at break <100 kg/cm$^2$, Elongation at break 1000%; UR3200:Urethane modified polyester resin, MW=40000, Tg=−3° C. Strength at break <100 kg/cm$^2$, Elongation at break 700% (both from Toyobo Co., Ltd.)

Example 15 a) Preparation of Laminated Body

A photothermal conversion layer (1 µm) was coated and dried on a 50-µm polyethylene terephthalate (PET) film (TEIJIN O Film, produced by Tejin Ltd.) (corresponding to the first intermediate layer in FIG. 1(*f*)) and thereon, an intermediate layer (corresponding to the second intermediate layer 9 in FIG. 1(*f*) (30 µm) was coated and dried. Furthermore, a pressure-sensitive adhesive (10 µm) was coated thereon to prepare a pressure-sensitive adhesive single-coated tape. Subsequently, this tape was laminated with a glass substrate using a roller to obtain glass substrate/pressure-sensitive adhesive layer/second intermediate layer/photothermal transfer layer/PET film (first intermediate layer).

Separately, a photocurable adhesive was coated on a silicon wafer. Then, this silicon wafer was laminated to the exposed PET film surface of the glass substrate/pressure-sensitive adhesive layer/second intermediate layer/photothermal conversion layer/PET film (first intermediate layer) article by means of the photocurable adhesive and irradiated with UV light from the glass substrate side to cure the adhesive. The adhesion area of the laminate was 314 cm$^2$.

b) Back Surface Grinding

The back surface of the silicon wafer in the laminated body state was ground to 50 µm.

c) Separation of Glass Substrate

The ground wafer surface of the resulting laminated body was attached to a dicing tape and then fixed on a vacuum chuck table. Then, a YAG laser (output: 7 W, wavelength: 1,064 nm) was used to irradiate the entire surface from the glass substrate side and thereby, the glass substrate was separated long with pressure sensitive adhesive/second intermediate layer from the PET Film (first intermediate layer).

d) Separation of Joining Layer

A pressure-sensitive adhesive tape (SCOTCH™ #3305, from 3M) was attached to the exposed surface of the first intermediate layer (PET film) and pulled up to remove the film and the joining layer from the wafer substrate.

e) Separation of Pressure-Sensitive Adhesive and Second Intermediate Layer

A pressure-sensitive adhesive tape (#3305) was attached to the exposed surface of the second intermediate layer and pulled up to remove en bloc the intermediate layer and the pressure-sensitive adhesive from the glass substrate.

Results:

It was confirmed that the adhesive layer was removed together with the film from the wafer surface without causing rupturing of the adhesive layer. On the wafer surface, residual glue and the like were not observed.

It was also confirmed that the intermediate layer and the pressure-sensitive adhesive were removed en bloc from the glass substrate surface. The glass substrate could be recycled by washing it with ethyl alcohol and pure water.

Example 16

A laminated body was produced and tested in the same manner as in Example 15 except that a multilayer optical film (3M™ Solar Reflecting Film, from 3M) was used in place of the PET film.
Results:
It was confirmed that the adhesive layer was removed together with the film from the wafer surface without causing rupturing of the adhesive layer. On the wafer surface, residual glue and the like were not observed.

It was also confirmed that the intermediate layer and the pressure-sensitive adhesive were removed en bloc from the glass substrate surface. The glass substrate could be recycled by washing it with ethyl alcohol and pure water. Furthermore, since a multilayer optical film which transmits light necessary for curing the photocurable adhesive to form a joining layer and reflects laser light necessary for the radiation energy treatment was used, the joining layer could be cured without any problem and at the same time, the circuitry pattern on the wafer could be protected from damage by the laser light.

The laminated body of the present invention enables the separating of a substrate ground to a very small thickness, from a support without damaging the substrate. The support and the substrate are separated by a radiation energy such as a laser beam, so that the joining layer can be easily separated from the substrate by peeling and an ultrathin substrate can be manufactured without damaging the substrate.

What is claimed is:

1. A method for manufacturing a laminated body, the method comprising
    coating on a light transmitting support a photothermal conversion layer precursor containing a light absorbing agent and a heat decomposable resin solution or a monomer or oligomer as a precursor material of a heat decomposable resin;
    drying to solidify or curing said photothermal conversion layer precursor to form a photothermal conversion layer on said light transmitting support;
    applying an adhesive to a substrate to be ground or the photothermal conversion layer to form a joining layer; and
    joining said substrate to be ground and said photothermal conversion layer through said joining layer under reduced pressure to form a laminated body,
    grinding said substrate, to a desired thickness to form a ground surface on one side of the thin substrate;
    disposing a die bonding tape on the ground surface of the substrate side of the laminated body,
    irradiating said photothermal conversion layer through said light transmitting support to decompose said photothermal conversion layer and thereby to separate said substrate and said light transmitting support after grinding; and
    peeling said joining layer from said substrate after grinding,
wherein the photothermal conversion layer comprises a light absorbing agent and a heat decomposable resin disposed beneath and in contact with the joining layer, and wherein the joining layer is an adhesive selected from the group consisting of rubber-base adhesives; one-part thermosetting adhesives based on epoxy or urethane; two-part thermosetting adhesives based on epoxy, urethane, or acryl; hot-melt adhesives based on acryl or epoxy; ultraviolet-curable adhesives based on acryl or epoxy; visible light-curable adhesives based on acryl or epoxy; electron beam-curable adhesives based on acryl or epoxy; and water dispersion-type adhesives.

2. A method according to claim 1 further comprising curing the adhesive to obtain a laminated body.

3. A method according to claim 1, wherein said substrate is a silicon wafer.

4. A method according to claim 1, wherein said light absorbing agent comprises carbon black.

5. A method according to claim 1, wherein said light absorbing agent is carbon black and the total amount of said carbon black in said photothermal conversion layer is from 5 to 70 vol %, based on the volume of said photothermal conversion layer.

6. A method according to claim 1, wherein said light absorbing agent is carbon black and the total amount of said carbon black in said photothermal conversion layer is 80% or more of a top filler volume concentration.

7. A method according to claim 1, wherein said support is glass.

8. A method according to claim 1, wherein said joining layer is a one-part thermosetting adhesive based on epoxy or urethane or a two-part thermosetting adhesive based on epoxy, urethane, or acryl.

9. A method according to claim 1, wherein a second intermediate layer is provided between said photothermal conversion layer and said light transmitting support, and said second intermediate layer and said light transmitting support are joined through another joining layer.

10. A method according to claim 1, wherein the laminated body is fixed by suction to a fixing plate prior to irradiating.

* * * * *

UNITED STATES PATENT AND TRADEMARK OFFICE
CERTIFICATE OF CORRECTION

| | | |
|---|---|---|
| PATENT NO. | : 7,988,807 B2 | Page 1 of 1 |
| APPLICATION NO. | : 12/360869 | |
| DATED | : August 2, 2011 | |
| INVENTOR(S) | : Kazuki Noda | |

It is certified that error appears in the above-identified patent and that said Letters Patent is hereby corrected as shown below:

First Page, Col. 1 (Related U.S. Application Data)
Line 1, delete "Continuation" and insert -- Divisional --, therefor.

Column 7
Line 67, delete "to" and insert -- too --, therefor.

Column 8
Line 29, delete "borneol" and insert -- borneol --, therefor.

Column 17
Line 28, delete "e.g." and insert -- e.g., --, therefor.
Line 29, delete "Properties" and insert -- Properties, --, therefor.

Column 18
Line 19, delete "Solasperse" and insert -- Solsperse --, therefor.
Line 35, delete "novolak" and insert -- novolac --, therefor.
Line 64, delete "Darocurel 173" and insert -- Darocure 1173 --, therefor.

Column 22
Line 33, after "dispersant" insert -- . --.

Colum 28
Line 15, delete "Tejin" and insert -- Teijin --, therefor.

Signed and Sealed this
Twenty-sixth Day of June, 2012

David J. Kappos
*Director of the United States Patent and Trademark Office*